United States Patent
Rodgers et al.

(10) Patent No.: US 6,937,131 B2
(45) Date of Patent: Aug. 30, 2005

(54) SELF-SHADOWING MEM STRUCTURES

(75) Inventors: Murray Steven Rodgers, Albuquerque, NM (US); Samuel Lee Miller, Albuquerque, NM (US)

(73) Assignee: Memx, Inc., Albuquerque, NM (US)

( * ) Notice: Subject to any disclaimer, the term of this patent is extended or adjusted under 35 U.S.C. 154(b) by 0 days.

(21) Appl. No.: 10/987,679

(22) Filed: Nov. 12, 2004

(65) Prior Publication Data

US 2005/0088765 A1   Apr. 28, 2005

Related U.S. Application Data

(62) Division of application No. 10/098,266, filed on Mar. 15, 2002, now Pat. No. 6,824,278.

(51) Int. Cl.⁷ .................... H01H 71/20; G02B 26/08
(52) U.S. Cl. ............... 337/144; 337/142; 337/150; 359/224
(58) Field of Search ................ 337/142, 144, 337/150, 154; 359/883, 884, 838, 224; 438/29, 438/69, 132, 467, 601; 327/525; 335/142; 29/623; 403/5; 385/16–18

(56) References Cited

U.S. PATENT DOCUMENTS

| | | | |
|---|---|---|---|
| 5,095,401 A |   | 3/1992 | Zavracky et al. ......... 361/283.4 |
| 5,151,153 A | * | 9/1992 | Bol ................................ 216/2 |
| 5,326,726 A |   | 7/1994 | Tsang et al. .................. 438/52 |
| 5,504,026 A |   | 4/1996 | Kung .......................... 438/50 |
| 5,637,904 A | * | 6/1997 | Zettler ........................ 257/417 |
| 5,696,619 A | * | 12/1997 | Knipe et al. ................ 359/224 |
| 5,783,340 A |   | 7/1998 | Farino et al. ................. 430/22 |
| 5,798,283 A |   | 8/1998 | Montague et al. ............ 438/24 |
| 5,804,084 A |   | 9/1998 | Nasby et al. .................. 216/2 |
| 5,814,554 A |   | 9/1998 | De Samber et al. ........ 438/611 |
| 5,919,548 A |   | 7/1999 | Barron et al. ............... 428/138 |
| 5,963,788 A |   | 10/1999 | Barron et al. ................ 438/48 |
| 5,994,816 A | * | 11/1999 | Dhuler et al. .............. 310/307 |
| 6,020,272 A |   | 2/2000 | Fleming .................... 438/734 |
| 6,082,208 A |   | 7/2000 | Rodgers et al. ............. 74/406 |

(Continued)

FOREIGN PATENT DOCUMENTS

EP            783108 A1 *   7/1997   ........... G01P 15/08

*Primary Examiner*—Anatoly Vortman
(74) *Attorney, Agent, or Firm*—Marsh Fischmann & Breyfogle LLP

(57) ABSTRACT

Self-shadowed microelectromechanical structures such as self-shadowed bond pads, fuses and compliant members and a method of fabricating self-shadowing microelectromechanical structures that anticipate and accommodate blanket metalization process steps are disclosed. In one embodiment, a self-shadowed bond pad (10) configured for shadowing an exposed end (44A) of a shielded interconnect line (44) connected to the bond pad (10) from undesired metalization during a metalization fabrication process step includes electrically connected overlaying first, second and third bond pad areas (42, 72, 92) patterned from respective first, second and third layers (40, 70, 90) of material deposited on a substrate (20). The exposed end (44A) of the interconnect line (44) abuts an edge of the first bond pad area (42). The third bond pad area (92) includes at least one tab portion (94) extending laterally from an edge of the third bond pad area (92) to shadow an area on the substrate (20) including the exposed end (44A) of the interconnect line (44) abutting the edge of the first bond pad area (42).

4 Claims, 22 Drawing Sheets

U.S. PATENT DOCUMENTS 6,199,269 B1 * 3/2001 Greco et al. ................... 29/700
6,501,107 B1 * 12/2002 Sinclair et al. ............. 257/209
6,545,385 B2 * 4/2003 Miller et al. ................. 310/309
2001/0048265 A1 12/2001 Miller et al. ................. 310/309

* cited by examiner

SELF-SHADOWING MEM STRUCTURES

RELATED APPLICATION INFORMATION

This application is a divisional of and claims priority from U.S. patent application Ser. No. 10/098,266 entitled "Self-Shadowing MEM Structures" filed on Mar. 15, 2002, now U.S. Pat. No. 6,824,278 the entire disclosure of which is incorporated by reference herein.

FIELD OF THE INVENTION

The present invention relates generally to microelectromechanical systems (MEMS), and more particularly to the design and fabrication of bond pads, fuses, compliant members and other MEMS structures portions of which preferably remain non-metalized.

BACKGROUND OF THE INVENTION

MEMS can include numerous electromechanical devices fabricated on a single substrate, many of which are to be separately actuated in order to achieve a desired operation. For example, a MEMS optical switch may include numerous mirrors that are each positionable in a desired orientation for reflecting optical signals between originating and target locations upon actuation of one or more microactuators associated with each mirror. In order for each mirror to be separately positioned, separate control signals need to be supplied to the microactuators associated with each mirror. One manner of accomplishing this is to connect each microactuator to a control signal source with a separate electrical conductor (i.e., an interconnect line) fabricated on the surface of the substrate that extends between its associated microactuator and a bond pad at the periphery of the substrate where it can be easily connected to an off-chip control signal source. In this regard, since there are numerous interconnect lines, there are typically numerous bond pads arranged in close proximity to each other along the periphery of the substrate.

In fabricating the multiple bond pads it may be desirable to employ a blanket metalization process step wherein the entire region of the substrate where the bond pads are located is covered with gold or another highly conductive material rather than trying to employ a shadow mask that restricts application of the metal to only the surfaces of the individual bond pads. However, such blanket metalization has the drawback that it may lead to short circuit conditions. For example, if the interconnect lines are electrically isolated from each other by overlying shield structures, the shield structures cannot contact the bond pads and thus must end prior to the bond pads thereby exposing the interconnect lines for a short distance in the gaps between the bond pads and the ends of the shield structures. Thus, if blanket metalization is employed, the exposed portions of the interconnect lines may receive undesired metalization leading to short circuits between individual interconnect lines and their associated shield structures or between adjacent interconnect lines. Furthermore, even if blanket metalization is not employed, slight misalignment of an appropriately configured shadow mask can also result in undesired metalization of the exposed portions of the interconnect lines.

SUMMARY OF THE INVENTION

Accordingly, the present invention provides self-shadowed microelectromechanical structures such as self-shadowed bond pads, fuses and compliant members (e.g., springs) and a method of fabricating self-shadowing microelectromechanical structures that anticipate and accommodate blanket metalization process steps. In accordance with the present invention, microelectromechanical structures are designed to incorporate upper level projections (e.g., tabs, cantilevered edges, or the like) that extend laterally outward from upper levels of the structures to shadow an area on the substrate including exposed lower level structures (e.g., ends of interconnect lines, fuse filaments or the like) that are to remain non-metalized. Thus, in accordance with the present invention, the necessary shadow masks are, in effect, incorporated directly into the structures that are fabricated thus allowing for blanket metalization and reducing the likelihood of errant metalization even when shadow masks are used in the metalization process.

According to one aspect of the present invention, a self-shadowed microelectromechanical structure configured for shadowing a portion thereof from undesired metalization during a metalization fabrication process step includes a lower layer of material deposited on a substrate. The lower layer of material may comprise an electrically conductive material, depending upon the requirements of the structures that are to be formed therefrom. In this regard, the substrate may be comprised of silicon covered by a dielectric stack (e.g., a lower layer of silicon oxide and upper layer of silicon nitride) and the electrically conductive material may comprise polysilicon doped with an appropriate material (e.g., phosphorous) to make it electrically conductive. A lower structure is patterned from the lower layer of material. The lower structure includes at least a portion that is to remain non-metalized. An upper layer of material is also deposited on the substrate. The upper layer of material may comprise an electrically conductive material (e.g., doped polysilicon), depending upon the requirements of the structures that are to be formed therefrom. There may be one or more intervening layers of sacrificial material (e.g., silicon oxide or silicate glass) and/or non-sacrificial material (e.g., additional doped polysilicon layers) between the lower and upper layers of electrically conductive material. Further, there may be one or more previously deposited layers (e.g., sacrificial material and/or non-sacrificial material) between the lower layer of material and the substrate. An upper structure is patterned from the upper layer of material. The upper structure includes a laterally extending portion thereof that extends laterally from the upper structure to shadow an area on the substrate that is outside of the main area occupied by the upper structure and that includes the portion of the lower structure that is to remain non-metalized. By way of example, the lower structure may comprise a shielded interconnect line having an exposed portion that is to remain non-metalized and the upper structure may comprise a bond pad area. In one embodiment, the laterally extending portion of the bond pad area comprises a tab extending laterally from an edge of the bond pad area to shadow the exposed portion of the interconnect line and also, preferably, a small area around the exposed portion of the interconnect line. In another embodiment, the entire edge of the bond pad area is cantilevered outward to shadow the exposed portion of the interconnect line and also a larger additional area adjacent to the bond pad area. By way of another example, the lower structure comprises an interconnect line having an exposed portion that is to remain non-metalized and the upper structure comprises a tab extending laterally to shadow the exposed portion of the interconnect line from a post extending upward from a shield structure overlying the interconnect line. By way of further example, the upper structure may comprise a positionable mirror and the lower electrically conductive structure may comprise at least one filament for holding the mirror in place until the filament is severed or at least one compliant member (e.g., a spring) connecting the mirror to other MEM structures (e.g., an actuator arm). In one embodiment, the laterally extending portion of the mirror comprises a tab extending laterally from an edge of the mirror to shadow the filament or compliant member and also, preferably, a small area around the filament or compliant member. In another embodiment the entire edge of the mirror is cantilevered outward to shadow the filament or compliant member and also a larger additional area adjacent to the mirror.

According to another aspect of the present invention, a method for self-shadowing a portion of a microelectromechanical structure fabricated on a substrate from undesired metalization during a metalization fabrication process step begins with depositing a lower layer of material on a substrate (e.g., a silicon substrate have a dielectric stack deposited thereon). Depending upon the requirements of the structures that are to be formed from the lower layer of material, the lower layer of material may be an electrically conductive material (e.g., doped polysilicon). A lower structure (e.g., an interconnect line, a filament, or a compliant member) is then patterned from the lower layer of material. An upper layer of material is then deposited on the substrate. Depending upon the requirements of the structures that are to be formed from the lower layer of material, the lower layer of material may be an electrically conductive material (e.g., doped polysilicon). One or more intervening layers of sacrificial material (e.g. silicon oxide or silicate glass) and/or non-sacrificial material (e.g., additional doped polysilicon layers) may be deposited and removed and/or patterned between deposition of the lower and upper layers of material. Further, the lower layer of material may be the first layer of material deposited on the substrate, or it may be deposited over one or more previously deposited layers (e.g., sacrificial material and/or non-sacrificial material). An upper structure (e.g. a bond pad area, a moveable mirror, or a post extending upward from a shield structure over an interconnect line) is patterned from the upper layer of material. In this regard, the upper structure is patterned to include a laterally extending portion thereof (e.g., a tab or a cantilevered edge) that extends laterally from the upper structure to shadow an area on the substrate outside of the main area occupied by the upper structure and including the portion of the lower structure that is to remain non-metalized.

According to a further aspect of the present invention, a self-shadowing bond pad configured for shadowing an exposed end of a shielded interconnect line connected to the bond pad from undesired metalization during a metalization fabrication process step includes a first bond pad area formed in a first layer of electrically conductive material (e.g., doped polysilicon) deposited on a substrate. In this regard, the exposed end of the interconnect line abuts an edge of the first bond pad area. At least one wall is formed in a second layer of electrically conductive material deposited on the substrate that extends upward from the first bond pad area. In one embodiment, the first bond pad area is rectangular and there are four walls extending upward from the first bond pad area adjacent to the perimeter of the first bond pad area. A second bond pad area is formed in the second layer of electrically conductive material. The second bond pad area is supported by the wall(s) formed in the second layer of electrically conductive material in an overlaying relationship above the first bond pad area. In one embodiment, the second layer of electrically conductive material is comprised of a thinner lower layer of doped polysilicon and a thicker upper layer of doped polysilicon. At least one wall is formed in a third layer of electrically conductive material that extends upward from the second bond pad area. In one embodiment, the second bond pad area is rectangular and there are four walls extending upward from the second bond pad area adjacent to the perimeter of the second bond pad area. A third bond pad area is formed in the third layer of electrically conductive material. The third bond pad area is supported by wall(s) formed in the third layer of electrically conductive material in an overlaying relationship above the second bond pad area. The third bond pad area includes at least one tab portion extending laterally from an edge of the third bond pad area to shadow an area on the substrate including the exposed end of the interconnect line abutting the edge of the first bond pad area. The rigidity of the first, second and third bond pad areas may be enhanced by having layers of dielectric material (e.g., silicon oxide or silicate glass) between the first bond pad area and the substrate, between the first bond pad area and the second bond pad area and between the second bond pad area and the third bond pad area. The self-shadowed bond pad may also include at least one wall formed in a fourth layer of electrically conductive material deposited on the substrate that extends upward from the third bond pad area. In one embodiment, the third bond pad area is rectangular and there are four walls extending upward from the third bond pad area adjacent to the perimeter of the third bond pad area. A fourth bond pad area is formed in the fourth layer of electrically conductive material and is supported by the wall(s) extending upward from the third bond pad area in an overlaying relationship above the third bond pad area. The fourth bond pad area includes at least one tab portion extending laterally from an edge of the fourth bond pad area over the tab portion extending from the edge of the third bond pad area. The rigidity of the tab portions of the third and fourth bond pad areas can be enhanced by fabricating a post that extends vertically between the tab portions. The rigidity of the fourth bond pad area may be enhanced by including a layer of dielectric material (e.g., silicon oxide or silicate glass) between the third and fourth bond pad areas.

According to one more aspect of the present invention, a self-shadowed microelectromechanical fuse structure for temporarily holding a moveable microelectromechanical structure in place while remaining non-metalized during a metalization fabrication process step includes lower and upper layers of material deposited on a substrate. The lower and upper layers of material may be electrically conductive material (e.g., doped polysilicon), depending upon the requirements of the structures formed therefrom. There may be one or more intervening layers of sacrificial material (e.g., silicon oxide or silicate glass) and/or non-sacrificial material (e.g., additional doped polysilicon layers) between the lower and upper layers of material. Further, there may be one or more previously deposited layers (e.g., sacrificial material and/or non-sacrificial material) between the lower layer of material and the substrate. The moveable microelectromechanical structure is patterned from both the lower and upper layers of material. At least one filament, and preferably multiple filaments, are patterned from the lower layer of material. The filament(s) are connected to the lower layer of the moveable microelectromechanical structure to temporarily hold the moveable microelectromechanical structure in place. The filament(s) may be severed (e.g., by application of a sufficient electrical current therethrough) to free the moveable microelectromechanical structure for desired movement. At least one tab (and possibly multiple tabs where there are multiple filaments distributed around the perimeter of the moveable structure), is patterned from the upper layer. The tab is supported over an area on the substrate including the filament to thereby shadow the filament during metalization of the moveable structure. In one embodiment, the tab extends laterally from an edge of the upper layer of the moveable microelectromechanical structure. In another embodiment, the tab extends laterally from an upper layer portion of a bond pad structure that is fixed to the substrate.

These and other aspects and advantages of the present invention will be apparent upon review of the following Detailed Description when taken in conjunction with the accompanying figures.

DESCRIPTION OF THE DRAWINGS

For a more complete understanding of the present invention and further advantages thereof, reference is now made to the following Detailed Description, taken in conjunction with the drawings, in which.

DETAILED DESCRIPTION

Figure 1A:
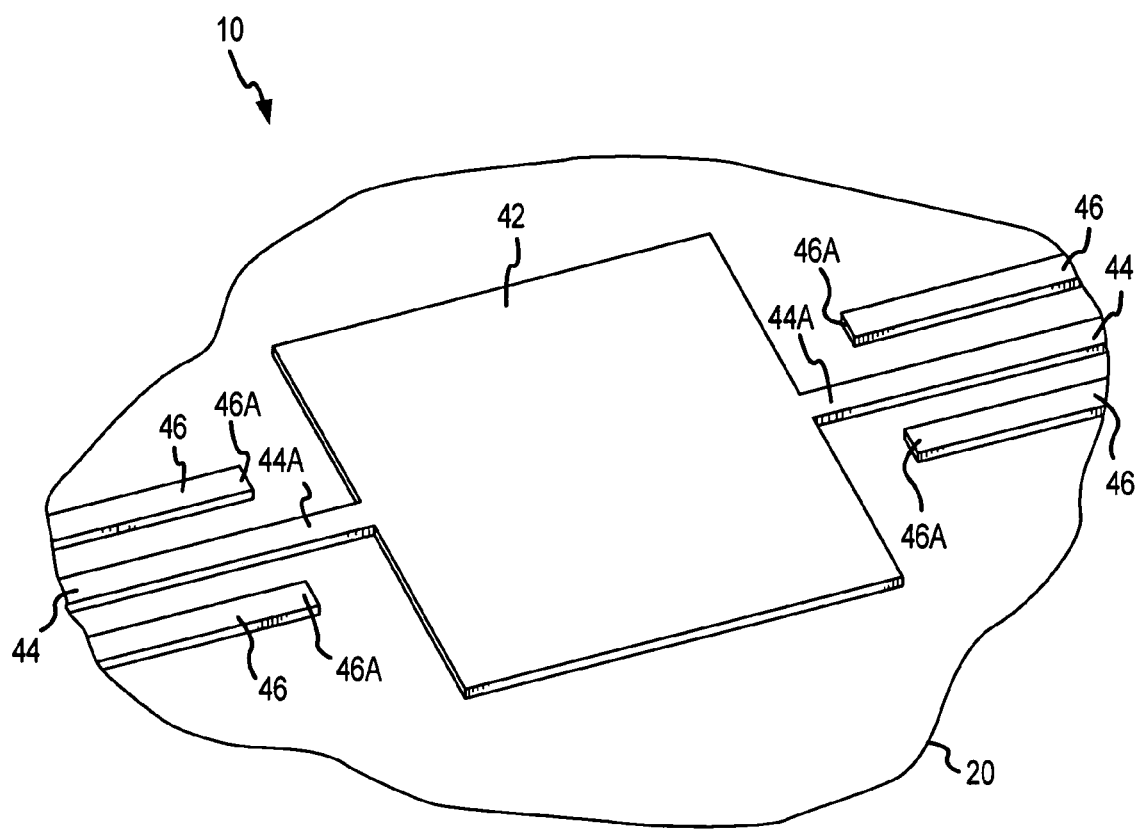
FIGS. 1A–G are perspective views illustrating the microfabrication process of one embodiment of a self-shadowed bond pad in accordance with the present invention.

In the description that follows, it should be noted that in the figures described herein, the various polysilicon and sacrificial layers and structures shown are idealized representations of the actual layers and structures that are formed in the various processing steps. In this regard, the corners of various structures may be somewhat rounded as opposed to square as is depicted, and polysilicon layers of material overlying sacrificial layers may, for example, have depressions coinciding with the locations of cuts made in the sacrificial layers instead of being perfectly level across the cuts. The size of the depressions and other defects, if any, may be reduced through the use of intermediate chemical mechanical polishing steps to planarize the various layers of polysilicon and sacrificial material after they are deposited.

Referring to FIGS. 1A–G, FIGS. 2A–G, and FIG. 3 there are shown perspective and top views, respectively, illustrating the microfabrication process of one embodiment of a self-shadowed bond pad 10. Although described in the context of the interface between an interconnect line and a bond pad, it will be appreciated that the self-shadowing concept herein described may generally be incorporated into many different electrical and non-electrical MEM structures. The microfabrication process begins with a substrate 20 having a first dielectric layer 30 formed thereon. In this regard, the substrate 20 may be comprised of silicon, and the first dielectric layer 30 may be comprised of a lower layer 30A of thermal oxide (e.g., typically about 630 nanometers thick) formed by a wet oxidation process at an elevated temperature (e.g., 1050° C. for about 1.5 hours) and an upper layer 30B of silicon nitride (e.g., typically about 800 nanometers thick) deposited over the thermal oxide layer using a low-pressure chemical vapor deposition (LPCVD) process at a temperature of about 850° C.

A first layer of an electrically conductive material (the first electrically conductive layer 40) is deposited over the first dielectric layer 30. The first electrically conductive layer 40 is comprised of an electrically conductive material such as, for example, polycrystalline silicon (also termed polysilicon). In this regard, the first electrically conductive layer 40 is also referred to herein as the Poly0 layer 40. The Poly0 layer 40 is typically about 300 nanometers thick with subsequent polysilicon layers being thicker (e.g., typically between about 1.0 and 2.5 microns thick). The Poly0 layer 40 (and other polysilicon layers described hereafter) may be deposited using a LPCVD process at a temperature of about 580° C. In depositing the Poly0 layer 40 (and other polysilicon layers described hereafter), various dopant materials (e.g., phosphorous) can be employed to make the polysilicon electrically conductive.

Figure 2A:
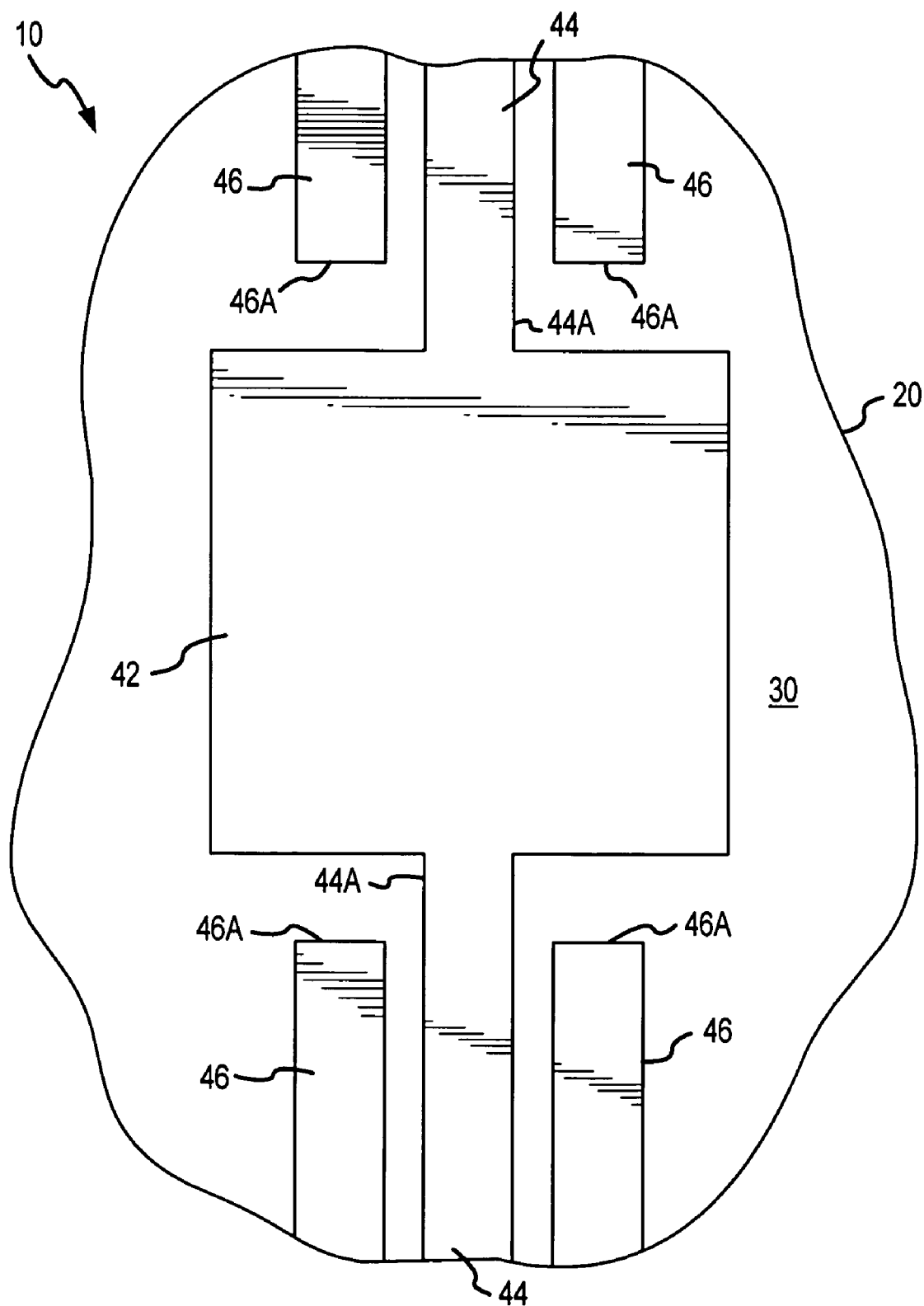
FIGS. 2A–G are top views illustrating enlarged portions of the self-shadowed bond pad shown in FIGS. 1A–G.

As is shown in FIGS. 1A and 2A, after the Poly0 layer 40 is deposited, the Poly0 layer 40 is patterned to provide a Poly0 bond pad area 42 that is connected with one or more Poly0 interconnect lines 44. In this regard, the Poly0 bond pad area 42 is rectangular, but it may be patterned is any desirable shape (e.g., circular, triangular, hexagonal, etc.). The Poly0 interconnect lines 44 meet the Poly0 bond pad area 42 at ends 44A thereof that abut the edge of the Poly0 bond pad area 42 and are shielded on either side thereof by Poly0 shield walls 46 extending parallel with and laterally spaced away from the Poly0 interconnect lines 44. The Poly0 shield walls 46 terminate at ends 46A that are separated by a small gap (e.g., one to a few microns) from the peripheral edge of the Poly0 bond pad area 42 so that the Poly0 shield walls 46 are electrically isolated from the Poly0 bond pad area 42. The Poly0 bond pad area 42 and Poly0 interconnect lines 44 are electrically isolated from the substrate 20 by the first dielectric layer 30, whereas the Poly0 shield walls 46 extend vertically down through the first dielectric layer 30 to contact the upper surface of the substrate 20.

Figure 1B:
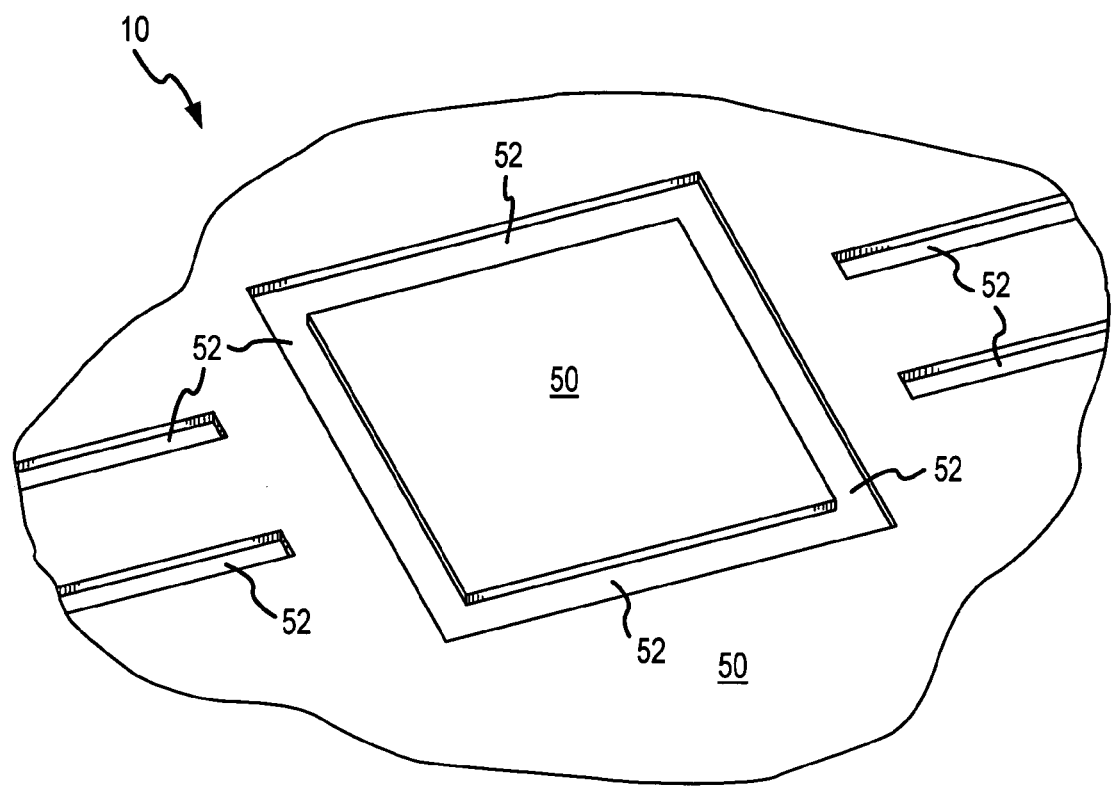
Figure 2B:
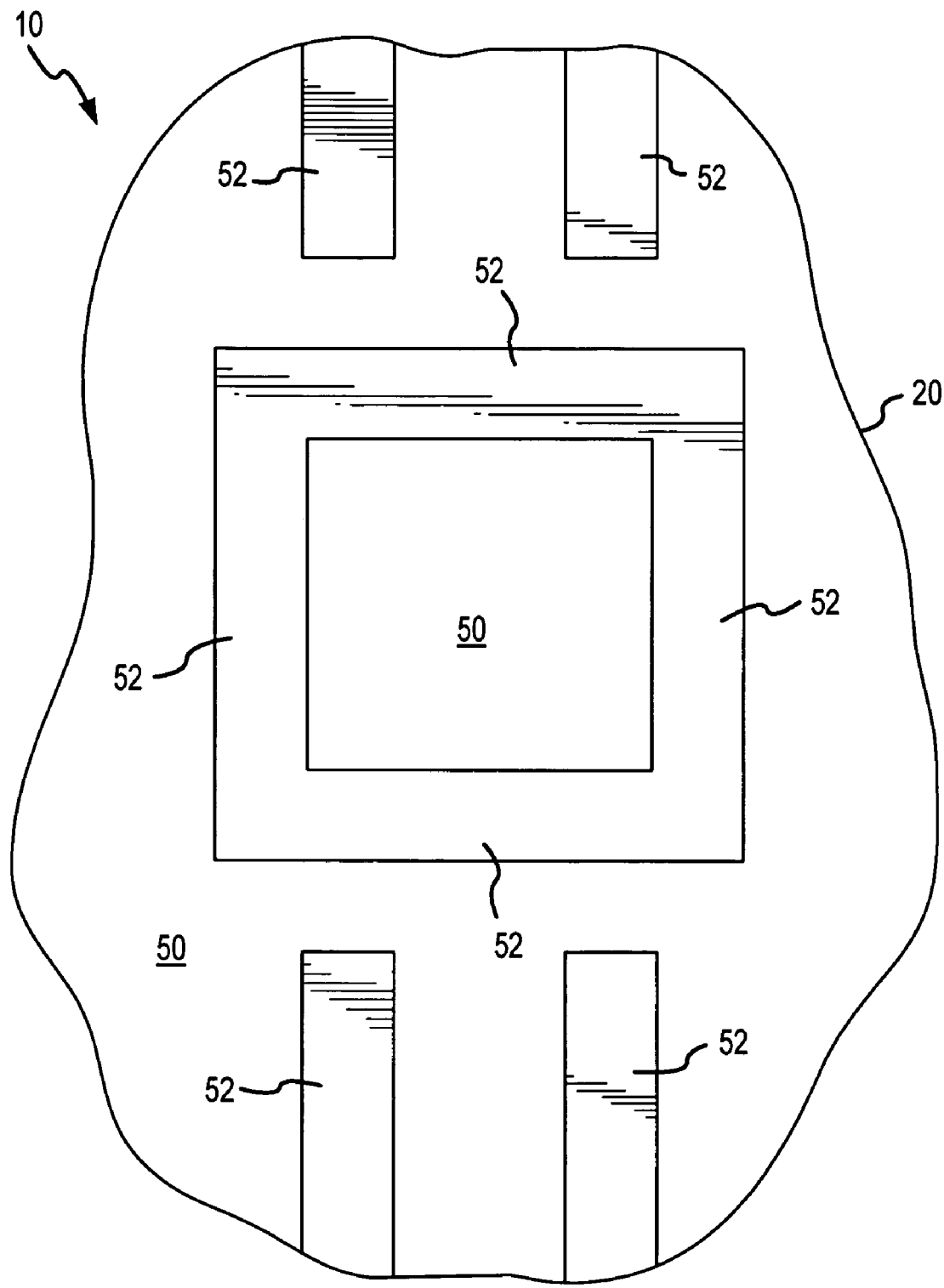

After the Poly0 bond pad area 42 is formed in the Poly0 layer 40, a second dielectric layer 50 is deposited over the Poly0 layer 40. The second dielectric layer 50 is comprised of an electrically insulating material such as, for example, a sacrificial material (e.g., silicon dioxide or silicate glass). In this regard, the second dielectric layer 50 is also referred to herein as the Sacox1 layer 50. The Sacox1 layer 50 (and other sacrificial layers described herein) may be deposited using a LPCVD process at a temperature of about 580° C. The Sacox1 layer 50 (and subsequent sacrificial layers) is typically about 2.0 microns thick. Cuts 52 are then made in the Sacox1 layer 50. The cuts 52, as with other features of the self-shadowed bond pad 10 wherein material is removed from one or more layers of material, may be formed, for example, by a mask and etch removal process employing appropriate masking agents and etchants depending upon the material that is to be removed. Each of the cuts 52 in the Sacox1 layer 50 is located within the perimeter of the Poly0 bond pad area 42 near the periphery of the Poly0 bond pad area 42. The cuts 52 extend down through the Sacox1 layer 50 to expose the upper surface of the Poly0 bond pad area 42 in one or more locations along the length of each cut 52, and preferably along the entire length of each cut 52. At the same time, cuts 52 may be made through the Sacox1 layer 50 over the Poly0 shield walls 46 to expose the upper surfaces of the Poly0 shield walls 46. FIGS. 1B and 2B show perspective and top views after the cuts 52 have been made in the Sacox1 layer 50 to expose the upper surfaces of the Poly0 bond pad area 40 and Poly0 shield walls 46.

After the cuts 52 are made in the Sacox1 layer 50, a second layer of electrically conductive material (the second electrically conductive layer 60) is deposited in the cuts 52 made in the Sacox1 layer. The second electrically conductive layer 60 is comprised of an electrically conductive material such as, for example, doped polysilicon. In this regard, the second electrically conductive layer 60 is also referred to herein as the Poly1 layer 60. The Poly1 layer 60 fills the bottom and sidewalls of the cuts 52 in the Sacox1 layer 50 and covers the remaining portions of the Sacox1 layer 50.

Figure 1C:
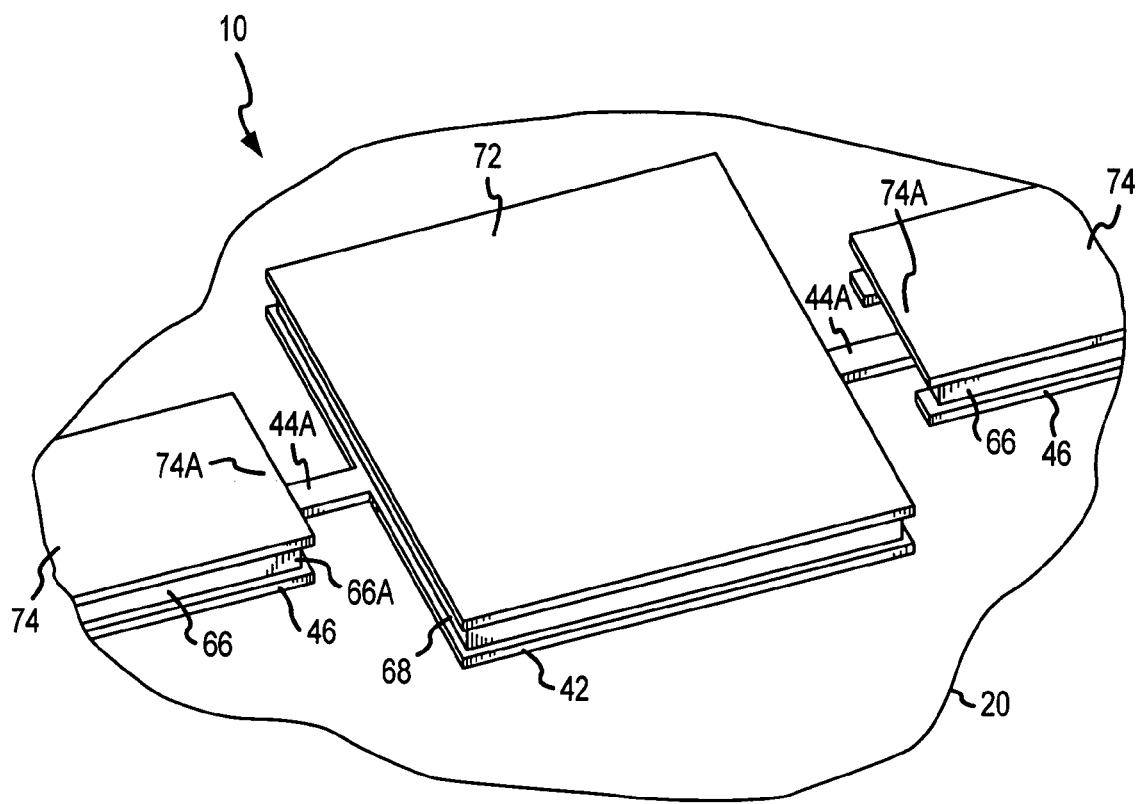
Figure 2C:
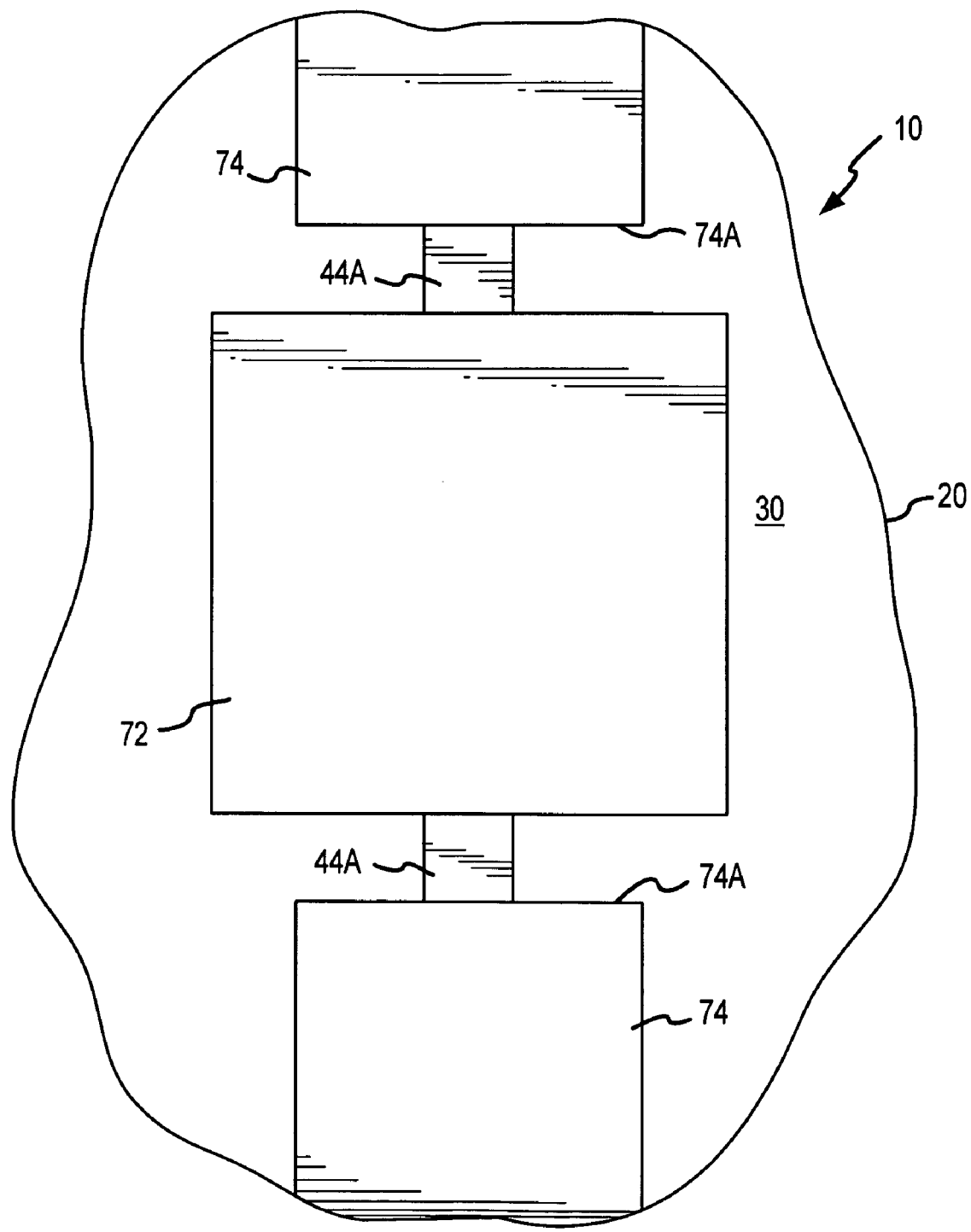

A third layer of electrically conductive material (the third electrically conductive layer 70) is then deposited over the Poly1 layer 60. The third electrically conductive layer 70 is comprised of an electrically conductive material such as, for example, doped polysilicon. In this regard, the third electrically conductive layer 70 is also referred to herein as the Poly2 layer 70. Prior to depositing the Poly2 layer 70 over the Poly1 layer 60, a third dielectric layer (not shown) of sacrificial material may have been deposited over the Poly1 layer 60 and removed from the regions of the Poly1 layer 60 of interest to the structures described herein. The third dielectric layer (the Sacox2 layer) may be utilized in maintaining desired separation between the Poly1 and Poly2 layers 60, 70 in other microelectromechanical structures, but such separation is not desired herein. In this regard, the Poly1 and Poly2 layers 60, 70 may be considered to be a single layer of polysilicon material. The Poly2 layer 70 typically fills in the remainder of the cuts 52 made in the Sacox1 layer 50 to form, together with the Poly1 layer 60 material in the cuts 52, Poly1/Poly2 shield walls 66 on top of the Poly0 shield walls 46 and Poly1/Poly2 support walls 68 on top of the Poly0 bond pad area 42. The cuts 52 made in the Sacox1 layer 50 over the Poly0 shield walls 46 do not extend all the way to the cuts 52 made over the Poly0 bond pad area 42 so that the ends 66A of the Poly1/Poly2 shield walls 66 are separated by a small gap (e.g., one to a few microns) from the Poly1/Poly2 support walls 68 so that the Poly1/Poly2 shield walls 66 are electrically isolated from the Poly1/Poly2 support walls 68. After the Poly2 layer 70 is deposited, the combined Poly1 and Poly2 layers 60, 70 are patterned to provide a Poly1/Poly2 bond pad area 72 supported over the Poly0 bond pad area 42 by the Poly1/Poly2 support walls 68 and Poly1/Poly2 shields 74 supported over the Poly0 interconnect lines 44 by the Poly0 and Poly1/Poly2 shield walls 46, 66. FIGS. 1C and 2C show perspective and top views of the self-shadowed bond pad 10 after the Poly1 and Poly2 layers 60, 70 have been patterned to provide the Poly1/Poly2 bond pad area 72 and Poly1/Poly2 shields 74.

The Poly1/Poly2 bond pad area 72 is electrically connected to and supported above the Poly0 bond pad area 42 by the Poly1/Poly2 support walls 68. The portion of the Sacox1 layer 50 encircled by the Poly1/Poly2 support walls 68 may remain between the Poly0 and Poly1/Poly2 bond pad areas 42, 72 after subsequent etching steps to provide further rigidity and support to the Poly1/Poly2 bond pad area 72. If desired, etch release holes may be included in the polysilicon structures described herein in order to allow for the removal of isolated or encapsulated sacrificial material. The Poly1/Poly2 shields 74 are typically electrically connected to the substrate 20 by the Poly0 and Poly1/Poly2 shield walls 46, 66 on either side of the Poly0 interconnect lines 44. The Poly1/Poly2 shields 74 terminate at ends 74A that are separated by a small gap (e.g. one to a few microns) from the peripheral edge of the Poly1/Poly2 bond pad area 72 so that the Poly1/Poly2 shields 74 are electrically isolated from the Poly1/Poly2 bond pad area 72.

Figure 1D:
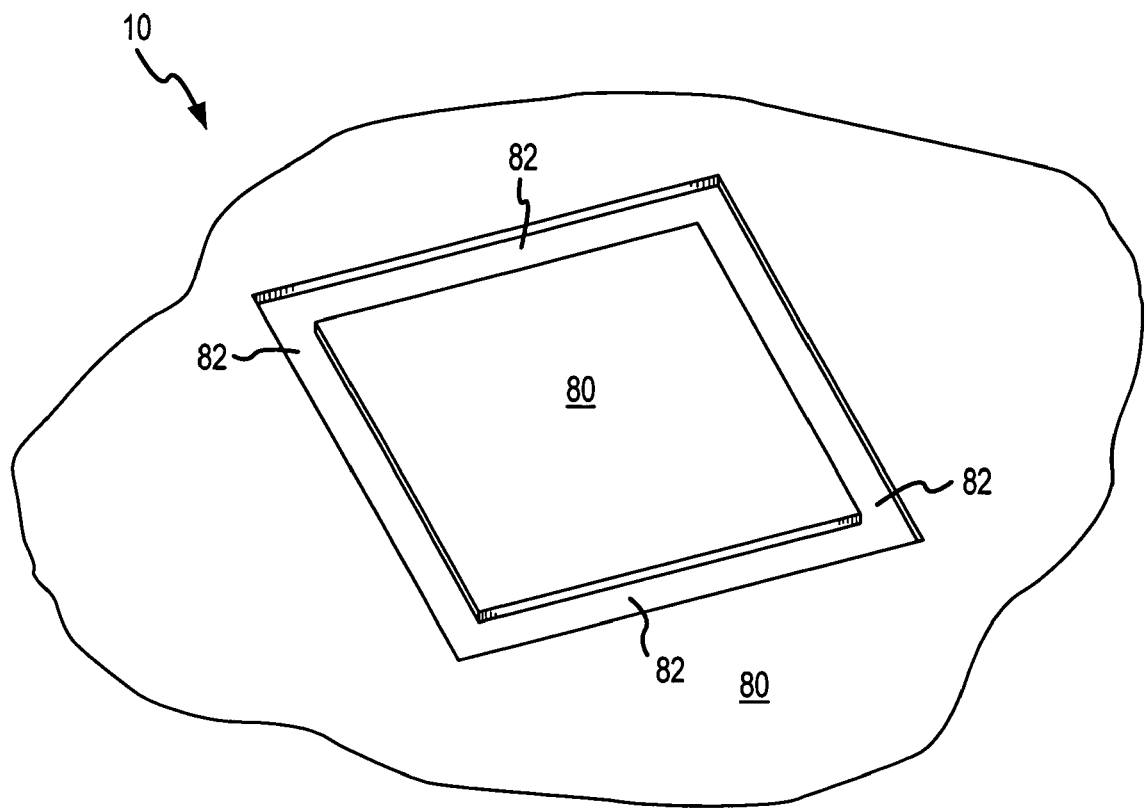
Figure 1E:
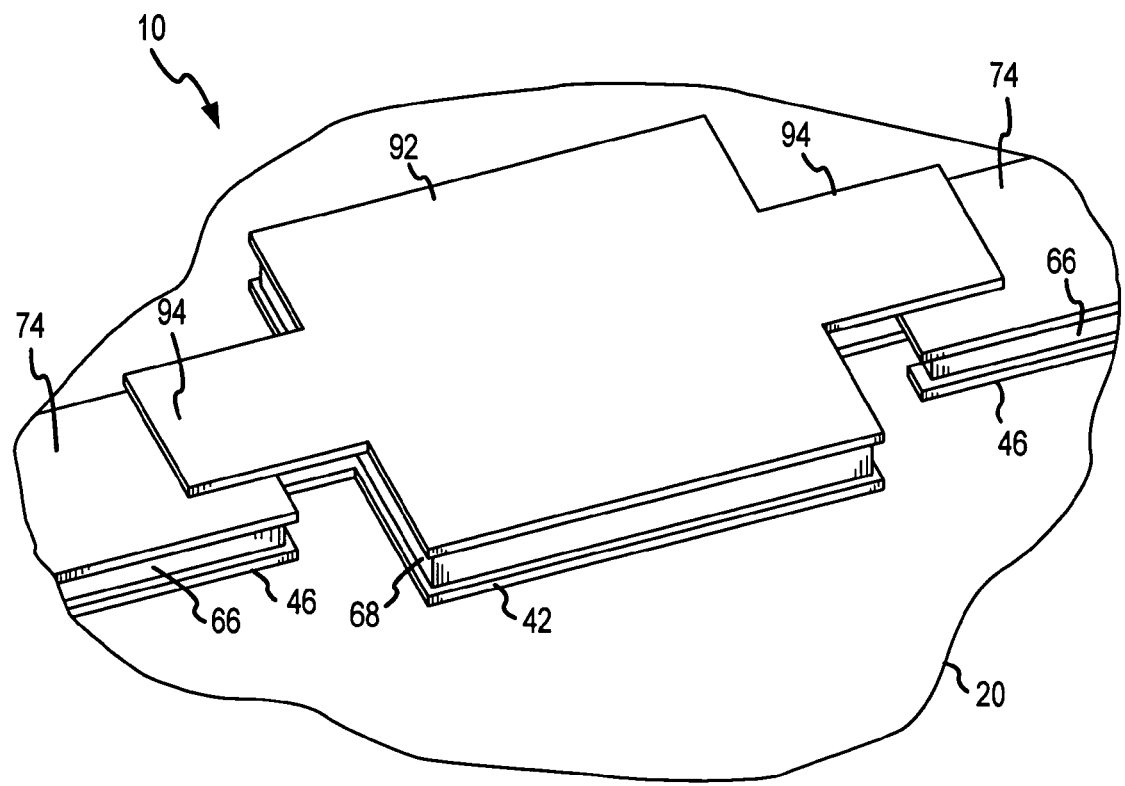
Figure 2D:
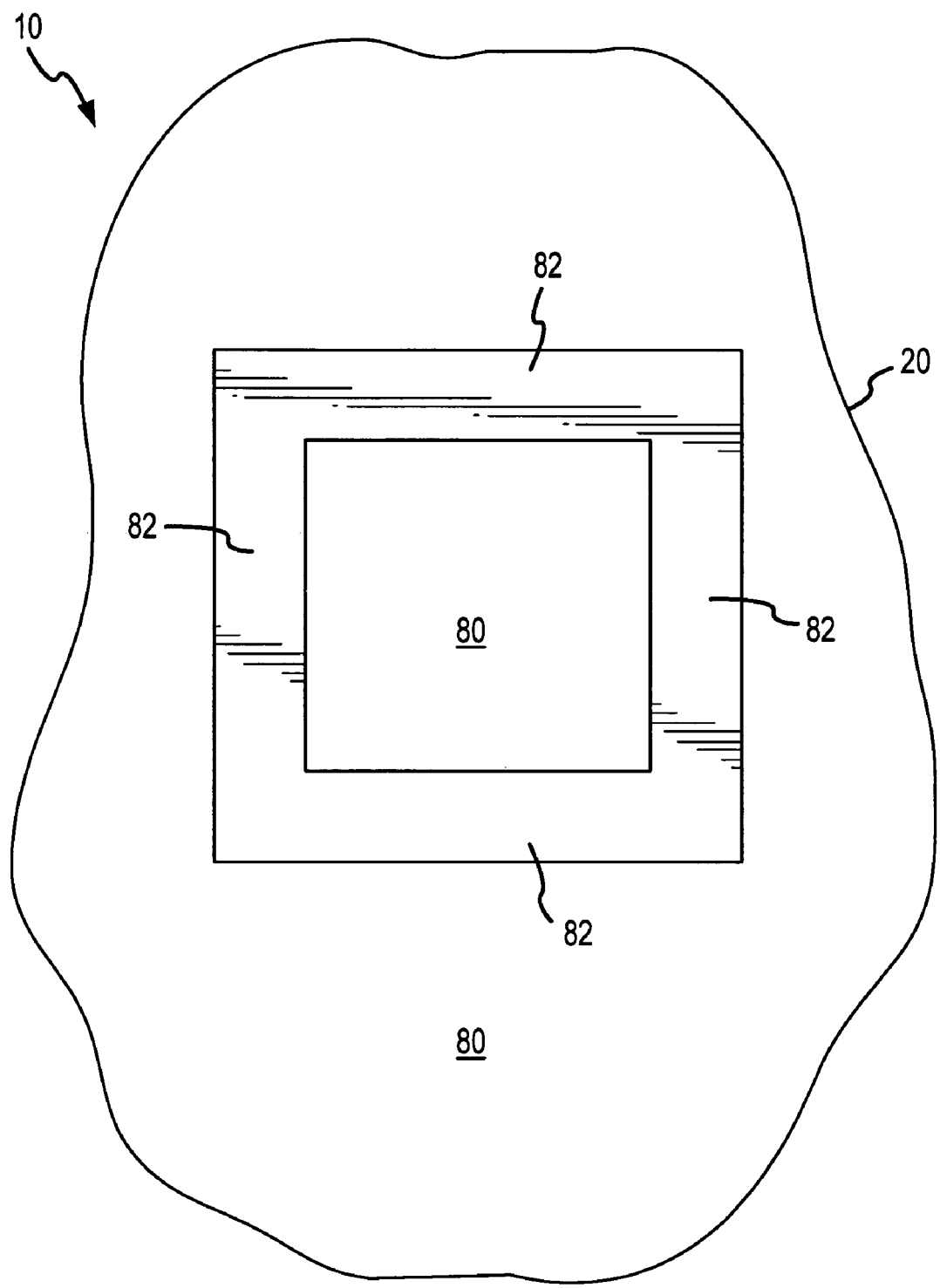
Figure 2E:
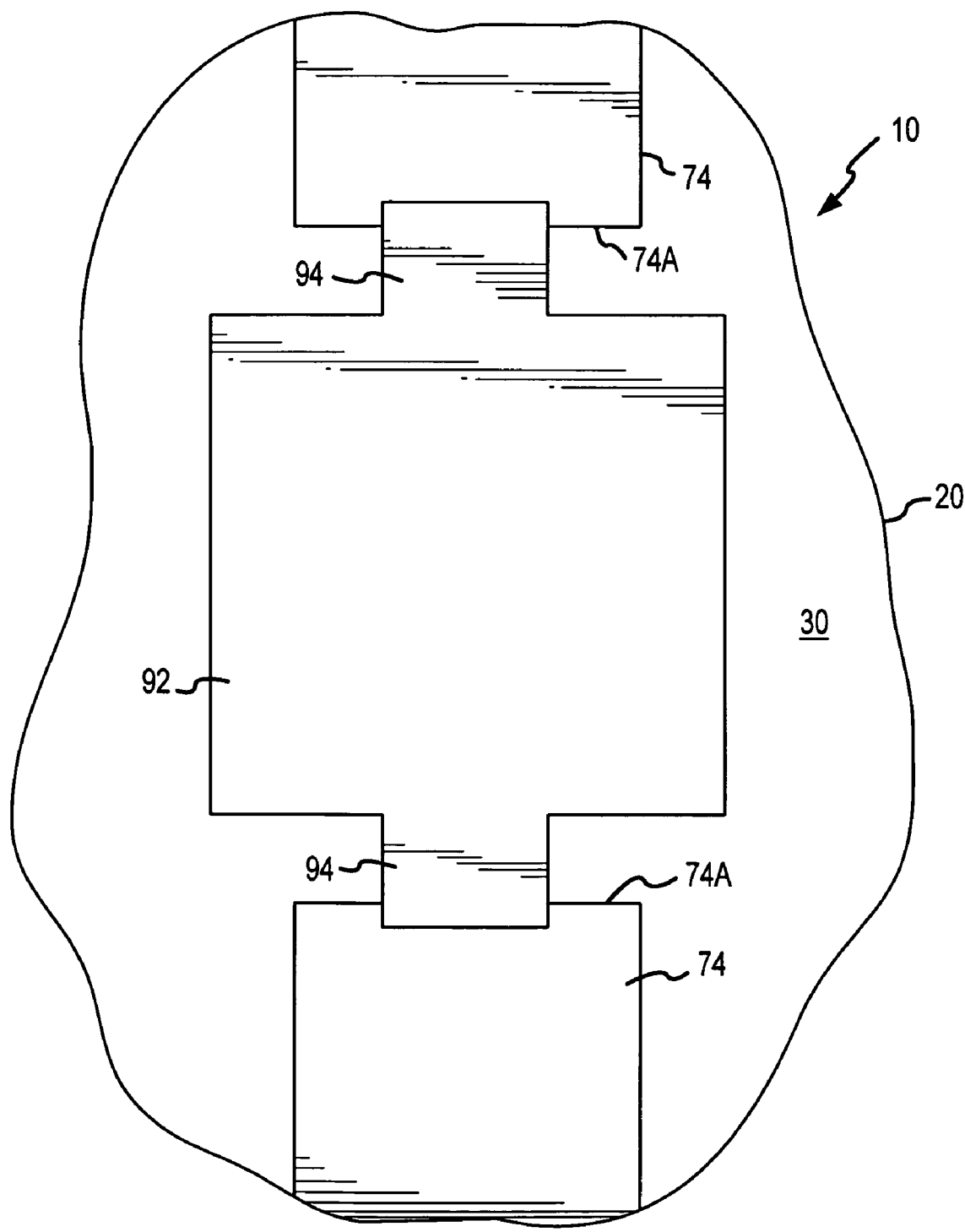

A fourth dielectric layer 80 is then deposited over the Poly2 layer 70. The fourth dielectric layer 80 is comprised of an electrically insulating material such as, for example, a sacrificial material (e.g. silicon dioxide or silicate glass). In this regard, the fourth dielectric layer 80 is also referred to herein as the Sacox3 layer 80. Cuts 82 are then made in the Sacox3 layer 80. Each of the cuts 82 in the Sacox3 layer 80 is located within the perimeter of the Poly1/Poly2 bond pad area 72 near the periphery of the Poly1/Poly2 bond pad area 72. The cuts 82 extend down through the Sacox3 layer 80 to expose the upper surface of the Poly1/Poly2 bond pad area 72 in one or more locations along the length of each cut 82, and preferably along the entire length of each cut 82. FIGS. 1D and 2D show perspective and top views of the self-shadowed bond pad 10 after the cuts 82 have been made in the Sacox3 layer 80.

After the cuts 82 are made in the Sacox3 layer 80, a fourth layer of electrically conductive material (the fourth electrically conductive layer 90) is then deposited over the Sacox3 layer 80 filling in the cuts 82 made in the Sacox3 layer 80 and covering the Sacox3 layer 80. The fourth electrically conductive layer 90 is comprised of an electrically conductive material such as, for example, doped polysilicon. In this regard, the fourth electrically conductive layer 90 is also referred to herein as the Poly3 layer 90. After being deposited, the Poly3 layer 90 is patterned to form a Poly3 bond pad area 92 overlying the Poly1/Poly2 bond pad area 72. The Poly3 bond pad area 92 includes one or more Poly3 tabs 94 extending outward from the periphery of the Poly3 bond bad area 92. The Poly3 bond pad area 92 is electrically connected and supported above the Poly1/Poly2 bond pad area 72 by Poly3 support walls 98 formed in the cuts 82 in the Sacox3 layer 80 upon deposition of the Poly3 material. The portion of the Sacox3 layer 80 encircled by the Poly3 support walls 98 may remain between the Poly1/Poly2 and Poly3 bond pad areas 72, 92 after subsequent etching steps to provide further rigidity and support to the Poly3 bond pad area 92.

The Poly3 tabs 94 extend outward from the periphery of the Poly3 bond pad area 92 at locations coinciding with the points where the ends 44A of the Poly0 interconnect lines 44 abut the Poly0 bond pad area 42. The Poly3 tabs 94 are sufficiently sized in order to shadow the exposed portions of the Poly0 interconnect line 44 in the gap between the Poly1/Poly2 shield 74 and the Poly1/Poly2 bond pad area 72. Preferably the Poly3 tabs 94 also shadow a small area around the exposed portions of the Poly0 interconnect lines 44 as well. In this regard, the Poly3 tabs 94 preferably overhang the ends 74A of the Poly1/Poly2 shields 74 by at least 1 micron and preferably are wider than the Poly0 interconnect line 44 by at least 1 micron on either side.

Figure 1F:
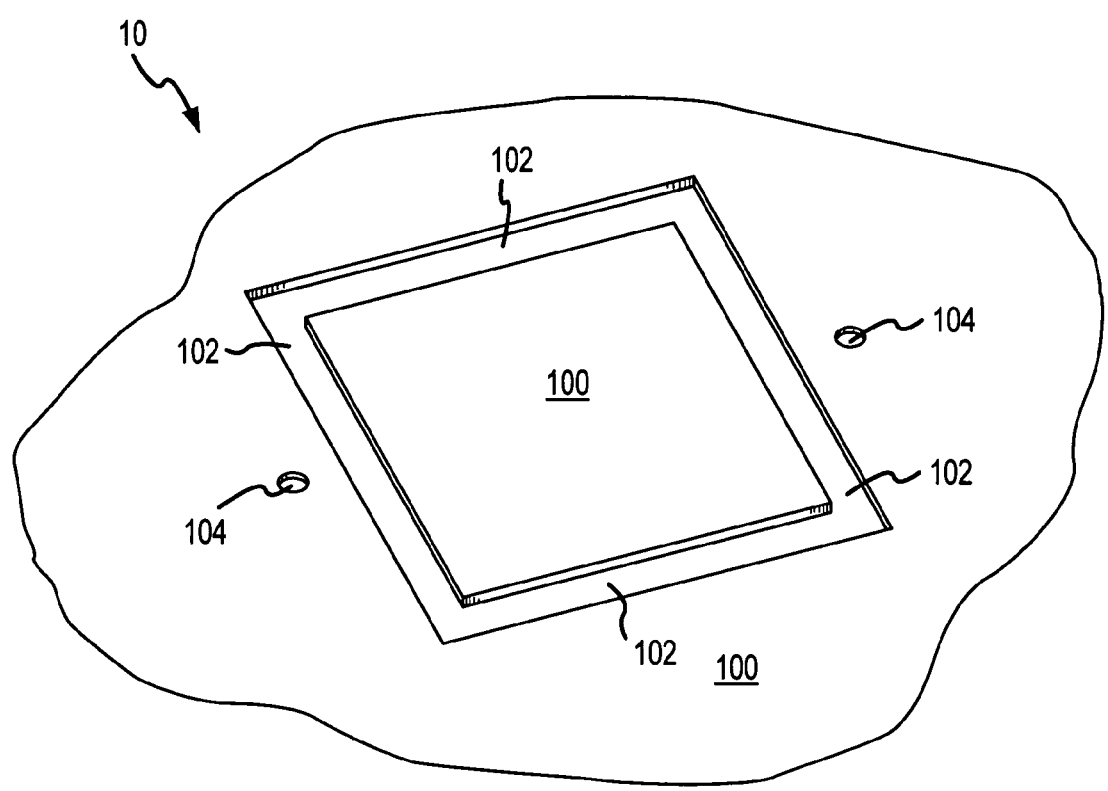
Figure 2F:
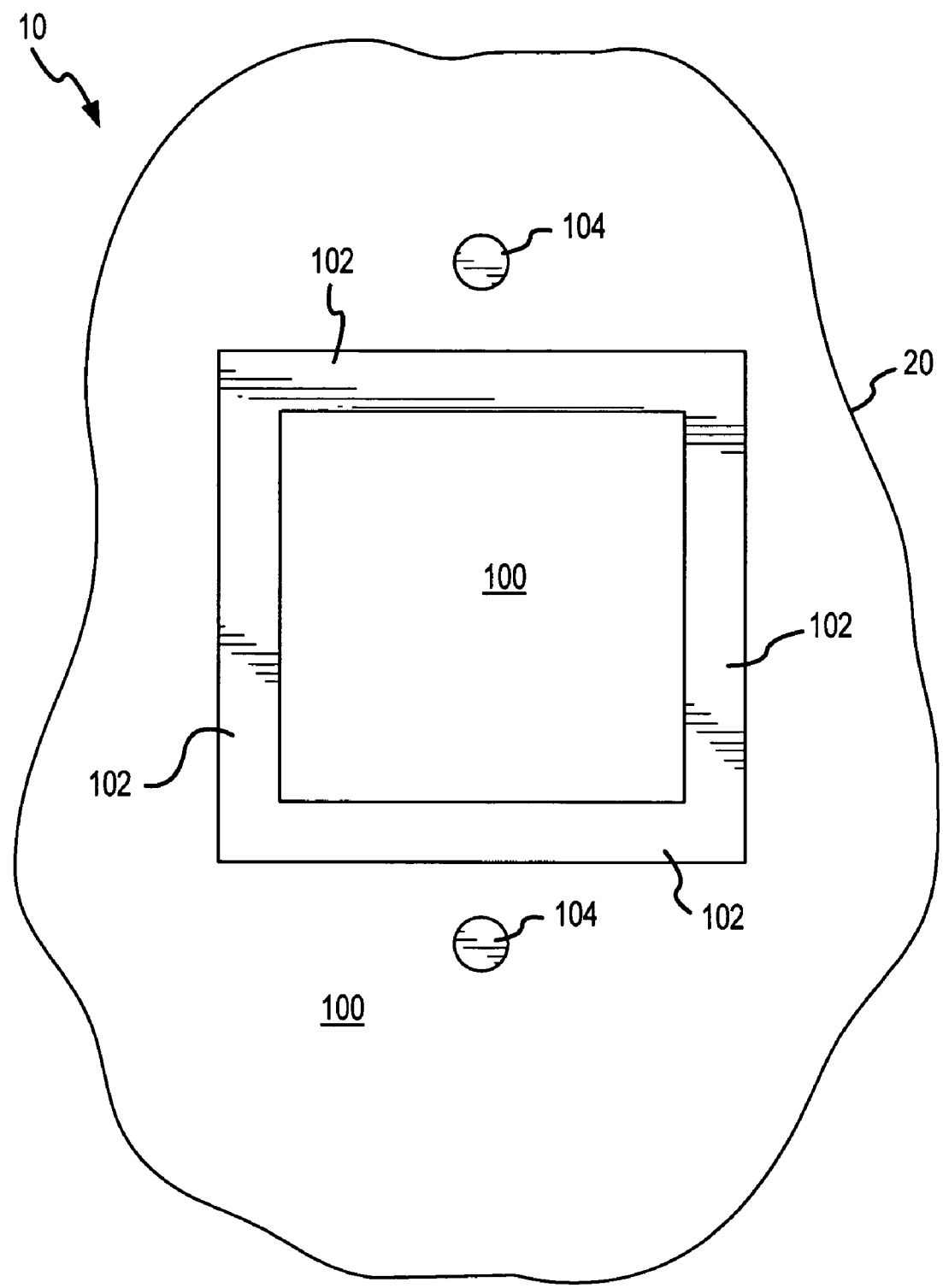

After the Poly3 layer 90 is patterned, an optional fifth dielectric layer 100 may then deposited over the Poly3 layer 90. The fifth dielectric layer 100 is comprised of an electrically insulating material such as, for example, a sacrificial material (e.g. silicon dioxide or silicate glass). In this regard, the fifth dielectric layer 100 is also referred to herein as the Sacox4 layer 100. Cuts 102 are then made in the Sacox4 layer 100. Each of the cuts 102 in the Sacox4 layer 100 is located within the perimeter of the Poly3 bond pad area 92, and as is illustrated, may be near the periphery of the Poly3 bond pad area 92. The cuts 102 extend down through the Sacox4 layer 100 to expose the upper surface of the Poly3 bond pad area 102 in one or more locations along the length of each cut 102, and preferably along the entire length of each cut 102. In addition to the cuts 102, holes 104 may also be formed in the Sacox4 layer 100. The holes 104 are located over the Poly3 tabs 94. FIGS. 1F and 2F show perspective and top views of the self-shadowed bond pad 10 after the cuts 102 and holes 104 have been made in the Sacox4 layer 100.

An optional fifth layer of electrically conductive material (the fifth electrically conductive layer 110) may then deposited over the Sacox4 layer 100 filling in the cuts 102 made in the Sacox4 layer 100 and covering the Sacox4 layer 100. The fifth electrically conductive layer 110 is comprised of an electrically conductive material such as, for example, doped polysilicon. In this regard, the fifth electrically conductive layer 110 is also referred to herein as the Poly4 layer 110. After being deposited, the Poly4 layer 110 is patterned to form a Poly4 bond pad area 112 overlying the Poly3 bond pad area 92. The Poly4 bond pad area 112 may include one or more Poly4 tabs 114 extending outward from the periphery of the Poly4 bond bad area 112. The Poly4 bond pad area 112 is electrically connected and supported above the Poly3 bond pad area 92 by Poly4 support walls 118 formed in the cuts 102 in the Sacox4 layer 100 upon deposition of the Poly4 material. The portion of the Sacox4 layer 100 encircled by the Poly4 support walls 118 may remain between the Poly3 and Poly4 bond pad areas 92, 112 after subsequent etching steps to provide further rigidity and support to the Poly4 bond pad area 112.

Figure 1G:
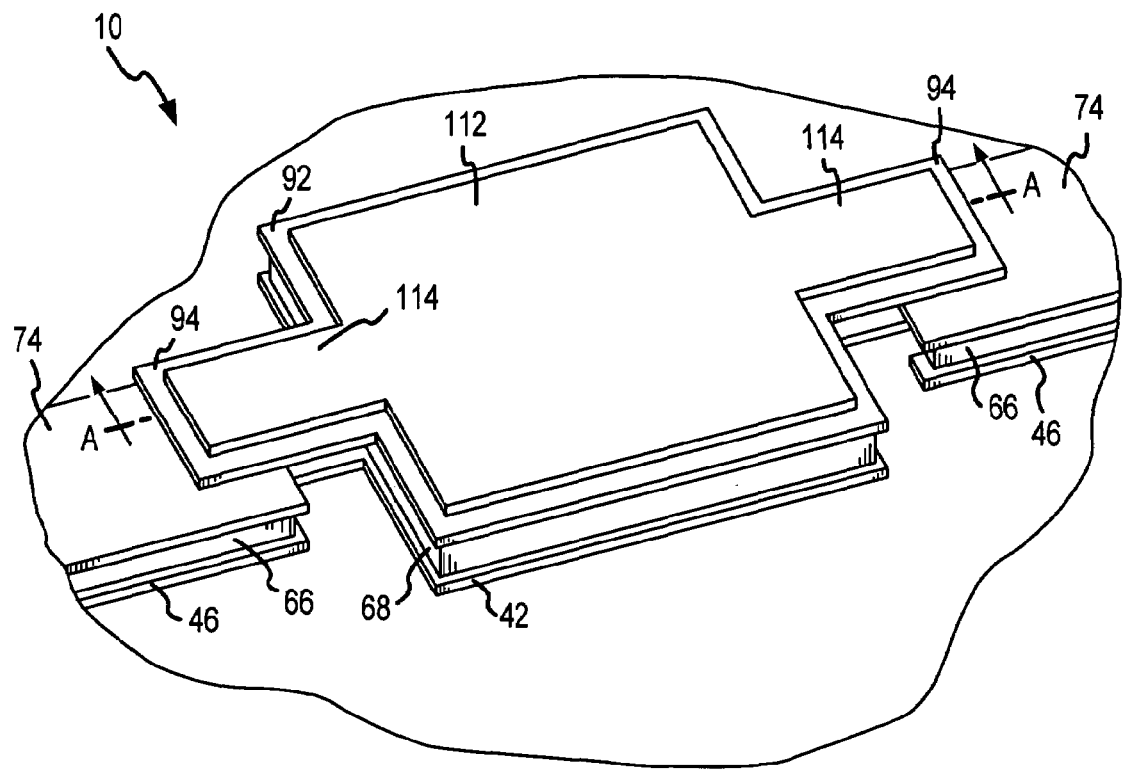
Figure 2G:
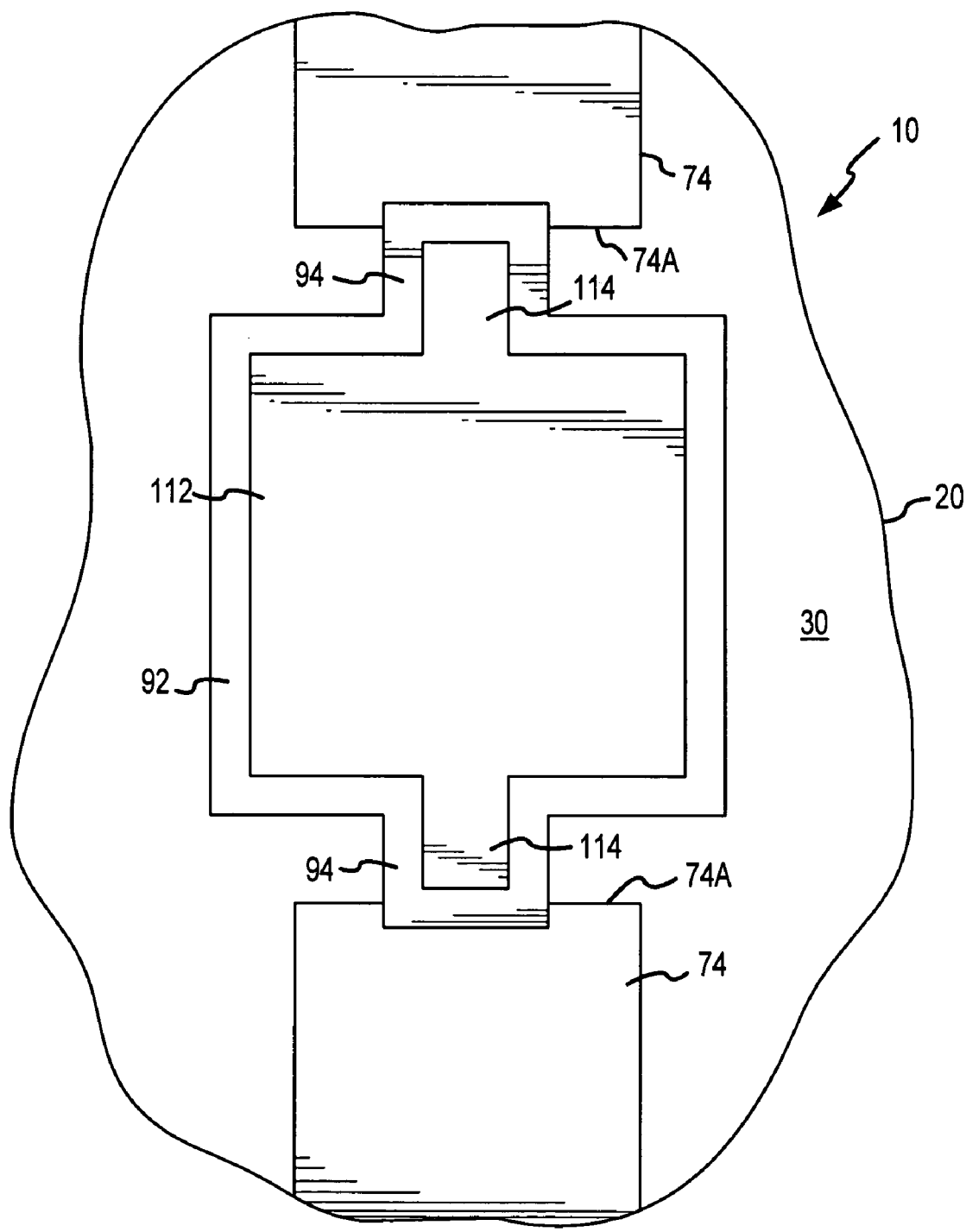
Figure 3:
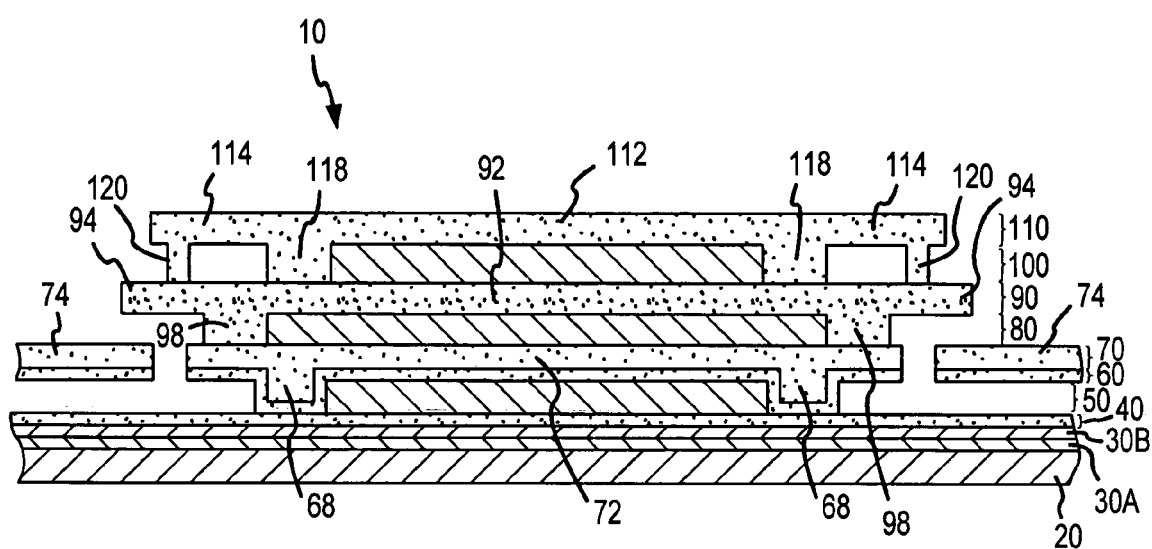
FIG. 3 is a cross-sectional view of the self-shadowed bond pad taken along line A—A in FIG. 1G.

The Poly4 tabs 114 extend outward from the periphery of the Poly4 bond pad area 112 in appropriate locations so that the Poly4 tabs 114 overly the Poly3 tabs 94. As is illustrated, the Poly4 tabs 114 may be slightly smaller or larger in area than the Poly3 tabs 94. The Poly4 tabs 114 help shadow the exposed portions of the Poly0 interconnect line 44 in the gap between the Poly1/Poly2 shield 74 and the Poly1/Poly2 bond pad area 72. The Poly4 tabs 114 may also be anchored to the Poly3 tabs 94 by anchor posts 120 comprised of Poly4 material that fills the holes 104 formed in the Sacox4 layer 100 above the Poly3 tabs 94. Anchoring the Poly4 tabs 114 to the Poly3 tabs 94 enhances vertical rigidity of the tabs 94, 114 thus reducing out of plane curvature due to metalization. This minimizes the possibility of inadvertent contact and breaking of the tabs 94, 114 during subsequent probing and/or bonding to the pad. FIGS. 1G and 2G show perspective and top views of the self-shadowed bond pad 10 after the Poly4 layer 110 has been deposited and patterned. FIG. 3 shows a cross-sectional view of the self-shadowed bond pad 10 taken along line A—A in FIG. 1G.

After the Poly4 bond pad area and tabs 112, 114 are patterned from the Poly4 layer 110, the Poly4 bond pad area 112 may be metalized in preparation for attaching electrical leads and the like thereto for connecting the MEMS device to off chip components or contacting the bond pad with probe leads or the like for testing purposes. In this regard, a blanket metalization process may be employed because the shadowing provided by the Poly 3 and Poly4 tabs 94, 114 prevents the gold or other material from shorting the Poly0 interconnect lines 44 to the Poly0 and Poly1/Poly2 shield walls 46,66 and the Poly1/Poly2 shields 74 where the Poly0 interconnect lines 44 are exposed. Additionally, the Poly3 and Poly4 tabs 94, 114 may also help reduce the possibility that loose particles on the surface of the chip might later contact the exposed Poly0 interconnect line 44 causing an undesirable short circuit condition with the Poly0 and Poly1/Poly2 shield walls 46,66 or the Poly1/Poly2 shields 74.

Although not illustrated, it should be noted that instead of having Poly3 and/or Poly4 tabs 94, 114 positioned at locations coinciding with the locations where the Poly0 interconnect lines 44 abut the Poly0 bond pad area 42, it is also possible to pattern the Poly3 and/or Poly4 bond pad areas 92, 112 to have cantilevered edges that extend outward along the entire length of one or more of the edges of the Poly3 and/or Poly4 bond pad areas 92, 112 to shadow one or more Poly0 interconnect lines 44. However, Poly3 and/or Poly4 tabs 94, 114 are preferred since their smaller area makes them less likely to be damaged when attaching probe leads or the like to the bond pad 10.

Although other microfabrication processes may be employed in fabricating the self-shadowed bond pad 10 as described above, the SUMMiT V™ surface micromachining process developed at Sandia National Laboratories and described, for example, in U.S. Pat. No. 6,082,208, issued Jul. 4, 2000 entitled "Method For Fabricating Five-Level Microelectromechanical Structures And Microelectromechanical Transmission Formed", incorporated by reference herein, is particularly useful for fabricating the self-shadowed bond pad 10. Employing the SUMMiT V™ surface micromachining process to fabricate the self-shadowed bond pad 10 permits easy incorporation of the self-shadowed bond pad 10 into MEM systems fabricated from five polysilicon levels such as some MEM mirror positioning systems useful in optical cross connects and the like.

Figure 4:
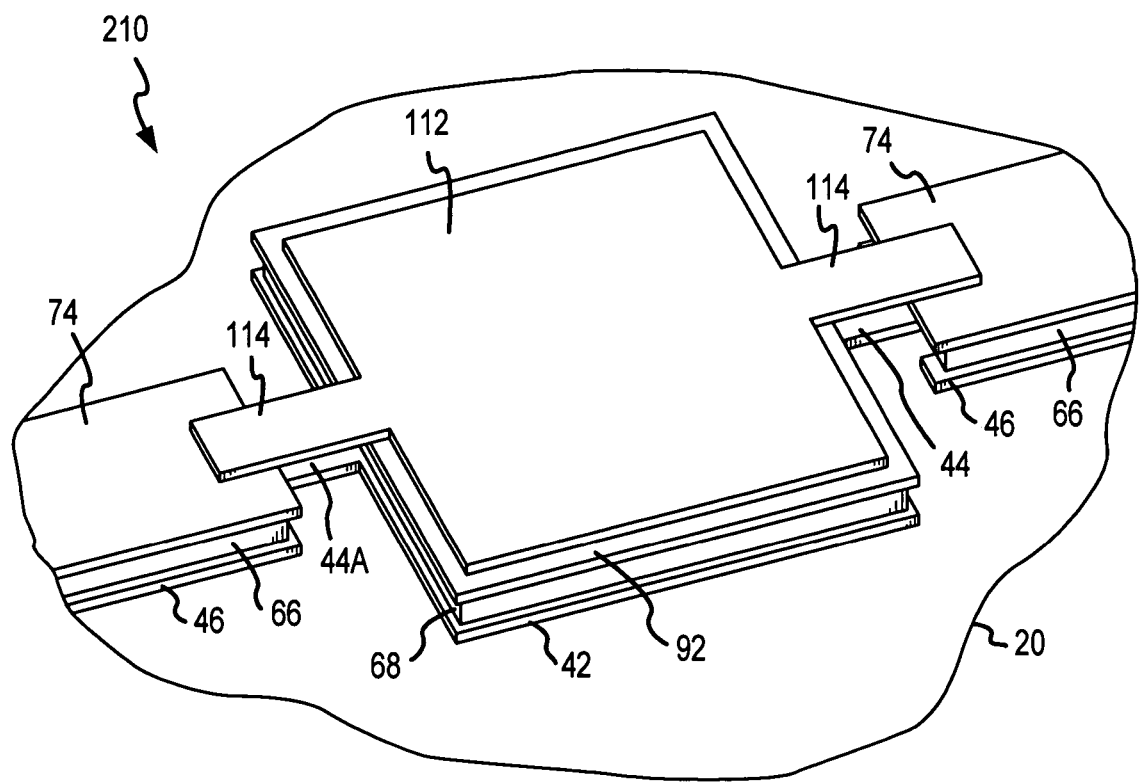
FIG. 4 is a perspective view of another embodiment of a self-shadowed bond pad in accordance with the present invention.
Figure 5:
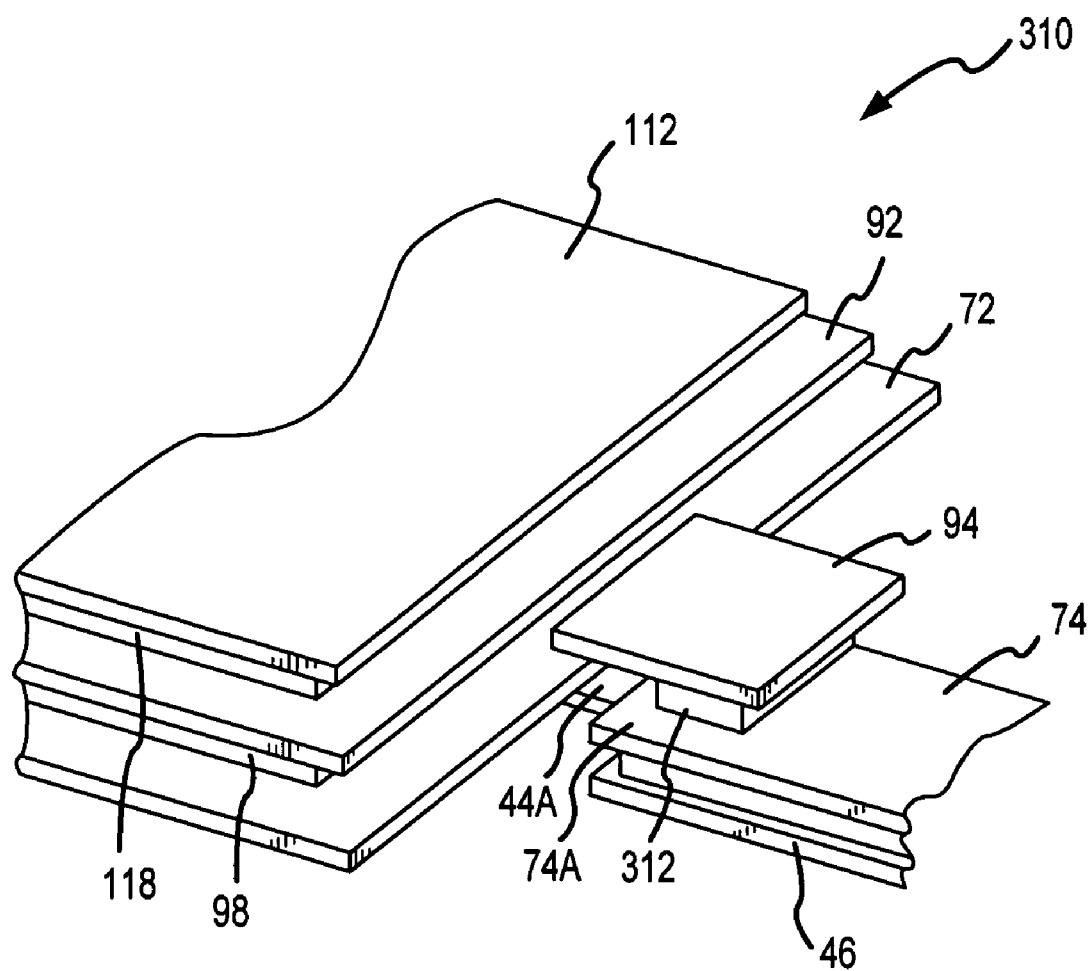
FIG. 5 is a perspective view of a further embodiment of a self-shadowed bond pad in accordance with the present invention.

Referring now to FIGS. 4–5, the concept of shadowing the exposed lower level polysilicon interconnect lines 44 with tabs or the like extending from the upper level polysilicon layers does not require a pair of overlying tabs that are anchored together nor do the tabs have to extend only from the bond pad areas. FIG. 4 illustrates a bond pad structure 210 wherein the Poly3 bond pad area 92 does not have any tab portions and only the Poly4 bond pad area 112 includes one or more tab portions 114 extending outward from the peripheral edges of the Poly4 bond pad area 112 that shadow the exposed Poly0 interconnect lines 44 in the gap between the Poly1/Poly2 shield 74 and the Poly1/Poly2 bond pad area 72. It is also possible to pattern the Poly4 bond pad area 112 without any tab portions and only have tab portions 94 extending outward from the Poly3 bond pad area 92.

By way of further example, the tab that shadows the desired area on the substrate need not be supported from the bond pad structure 10. FIG. 5 illustrates an exemplary self-shadowed bond pad structure 310 wherein the Poly3 tab 94 is supported from a Poly3 post 312 extending upward from the Poly1/Poly2 shield 72 rather than extending outward from the Poly3 bond pad area 92. The Poly3 tab 94 extends past the end 74A of the Poly1/Poly2 shield 74 to overhang and thereby shadow the exposed Poly0 interconnect line 44 in the gap between the Poly1/Poly2 shield 74 and the Poly1/Poly2 bond pad area 72. As is shown in FIG. 5, the Poly3 bond pad area 92 (and also possibly the Poly4 bond pad area 112) may need to be staggered back from the perimeter of the Poly1/Poly2 bond pad area 72 in a tiered fashion in order to allow the Poly3 tab 94 to extend slightly over the edge of the Poly1/Poly2 bond pad area 72 without contacting the Poly3 bond pad area 92 causing a short circuit condition.

Figure 6A:
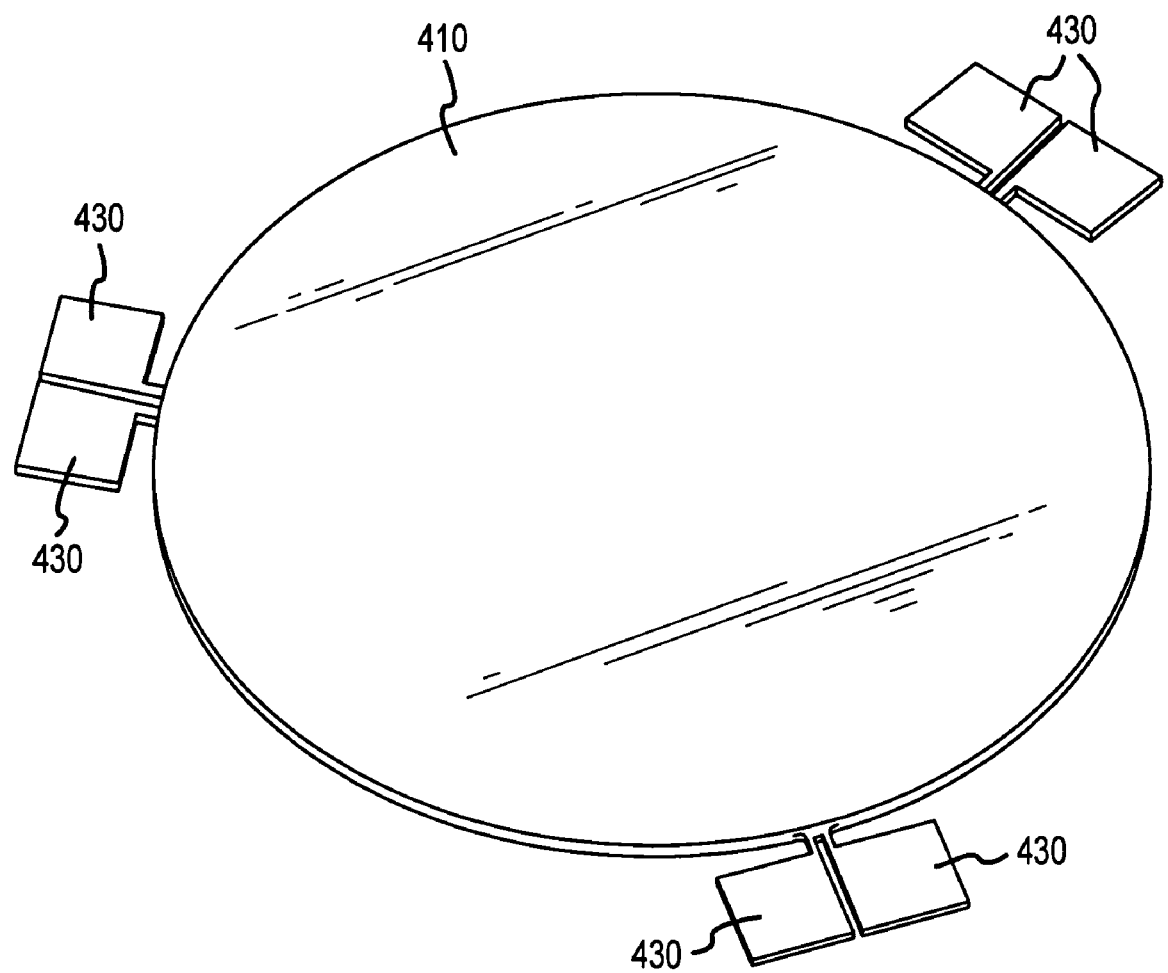
FIGS. 6A–B are perspective views showing one embodiment of a MEM mirror that is temporarily held in place by a plurality of non-shadowed filaments arranged around the periphery of the MEM mirror.
Figure 6B:
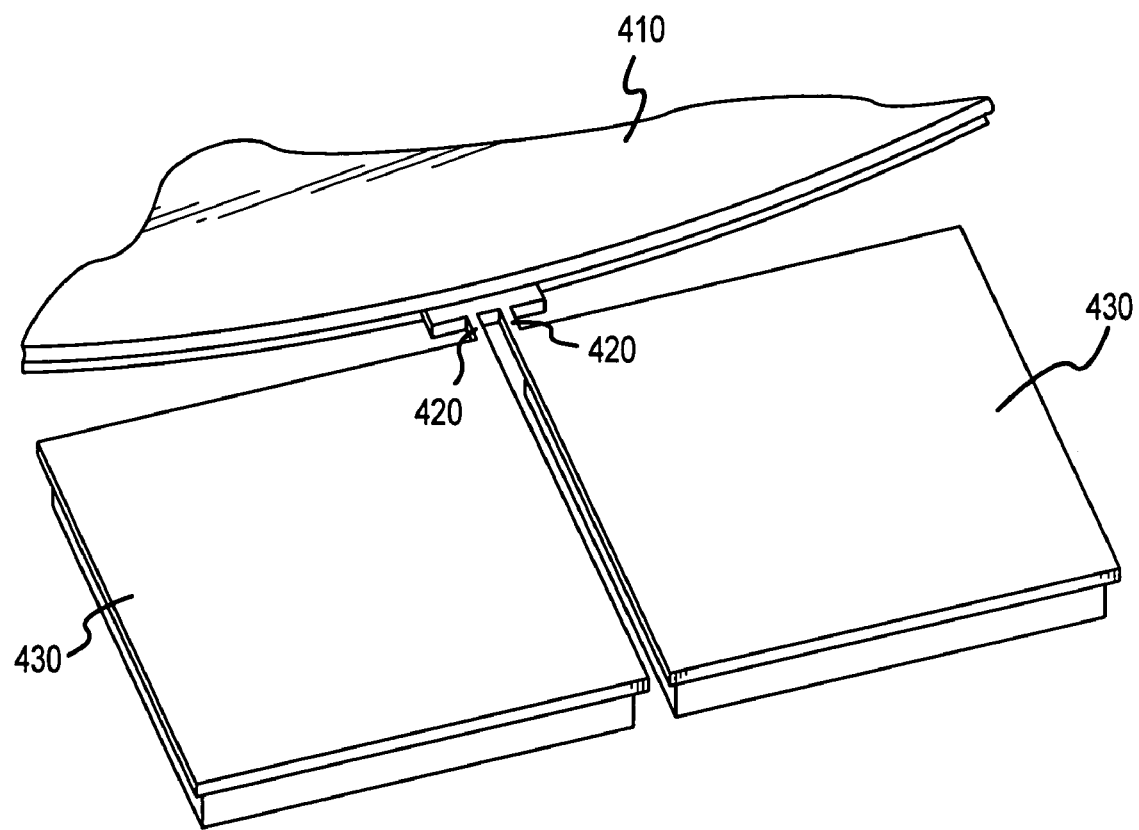
Figure 6C:
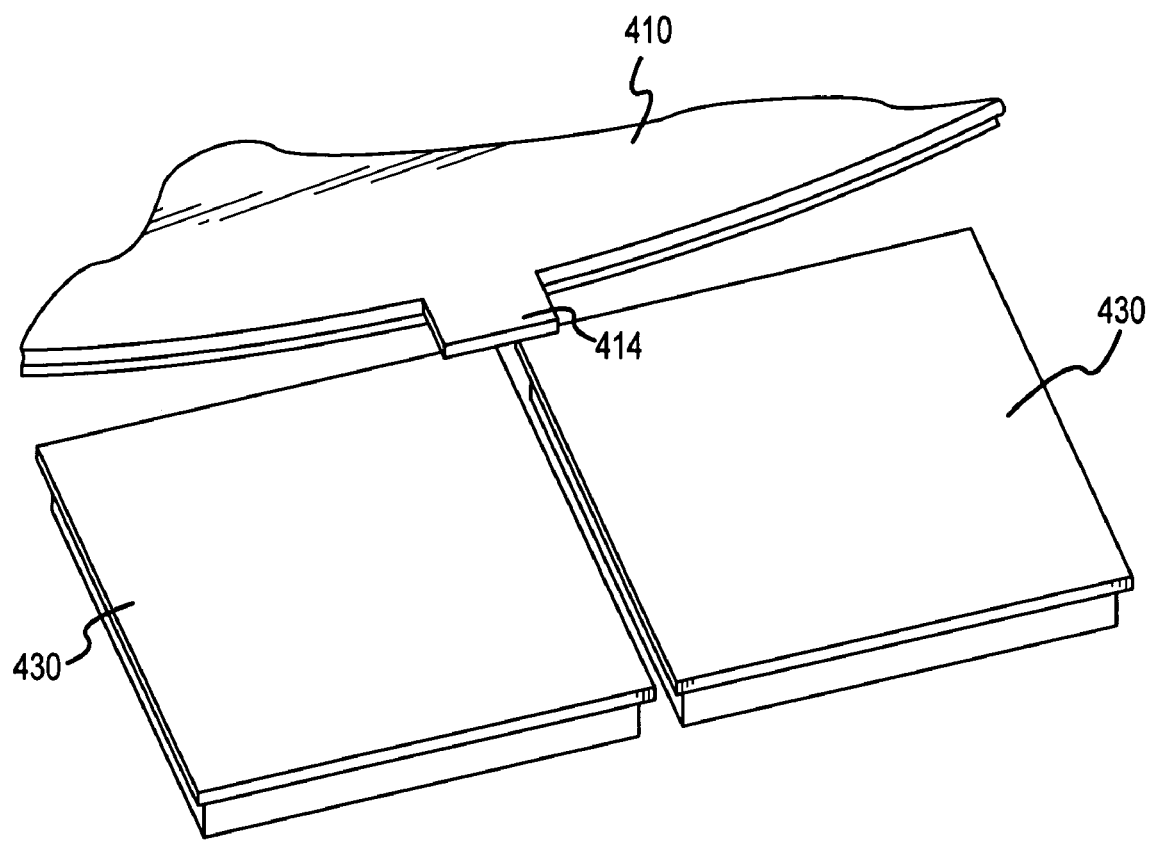
FIG. 6C is a perspective view of a portion of one embodiment of a MEM mirror configured to shadow the filaments in accordance with the present invention.

Referring now FIGS. 6A–C, the concept of shadowing exposed lower level polysilicon structures with tabs, cantilevered edges or the like extending from upper level polysilicon structures is not restricted to only bond pad structures. By way of example, FIG. 6A shows a perspective view of one embodiment of a positionable MEM mirror 410 that is held in place during various processing steps by thin polysilicon filaments 420 (e.g., fuses) extending from polysilicon bond pads 430 arranged in pairs around the periphery of the MEM mirror 410. FIG. 6B shows an enlarged perspective view of two of the filaments 420. The filaments 420 are severed (e.g., burned by sending sufficient electrical current therethrough) prior to positioning the MEM mirror 410 in a desired orientation by lifting and/or tilting it about one or more axes. In this regard, it is desirable that the filaments 420 not become metalized when the surface of the MEM mirror 410 is metalized (e.g., with gold) to enhance its reflectivity since metalized filaments will have different electrical characteristics. Due to their proximity to the periphery of the MEM mirror 410, it is quite possible that some of the filaments 420 may become metalized even if a shadow mask is employed when metalizing the surface of the MEM mirror 410. For example, if the mask is slightly offset in one direction, some of the filaments 410 may be metalized while other filaments 420 are not metalized making the optimal electrical signal required to sever the metalized filaments 420 different from that required to sever the non-metalized filaments 420, possibly resulting in reduced yields on automated testing equipment.

FIG. 6C shows one manner of reducing or eliminating possible metalization of the filaments 420 holding MEM mirror 410 in place. In the embodiment of FIG. 6C, the upper polysilicon layer of the MEM mirror 410 is patterned to include a tab portion 414 that extends outward from the periphery of the MEM mirror 410 in order to shadow an area on the substrate 20 encompassing the filaments 420. It is not required that the tab portion 414 be attached to the moveable structure (i.e., the MEM mirror 410). For example, one of the bond pads 430 could include another upper level layer of polysilicon that includes a tab overhanging the filaments 420 similar to the previously described bond pad structures. However, having the tab portion 414 attached to the MEM mirror 410 may be preferable since portions of the severed filaments 420 that remain attached to the MEM mirror 410 will not come into contact with the tab portion 420 when the MEM mirror 410 is lifted and/or tilted thereby possibly restricting or altering the movement of the MEM mirror 410.

Figure 7A:
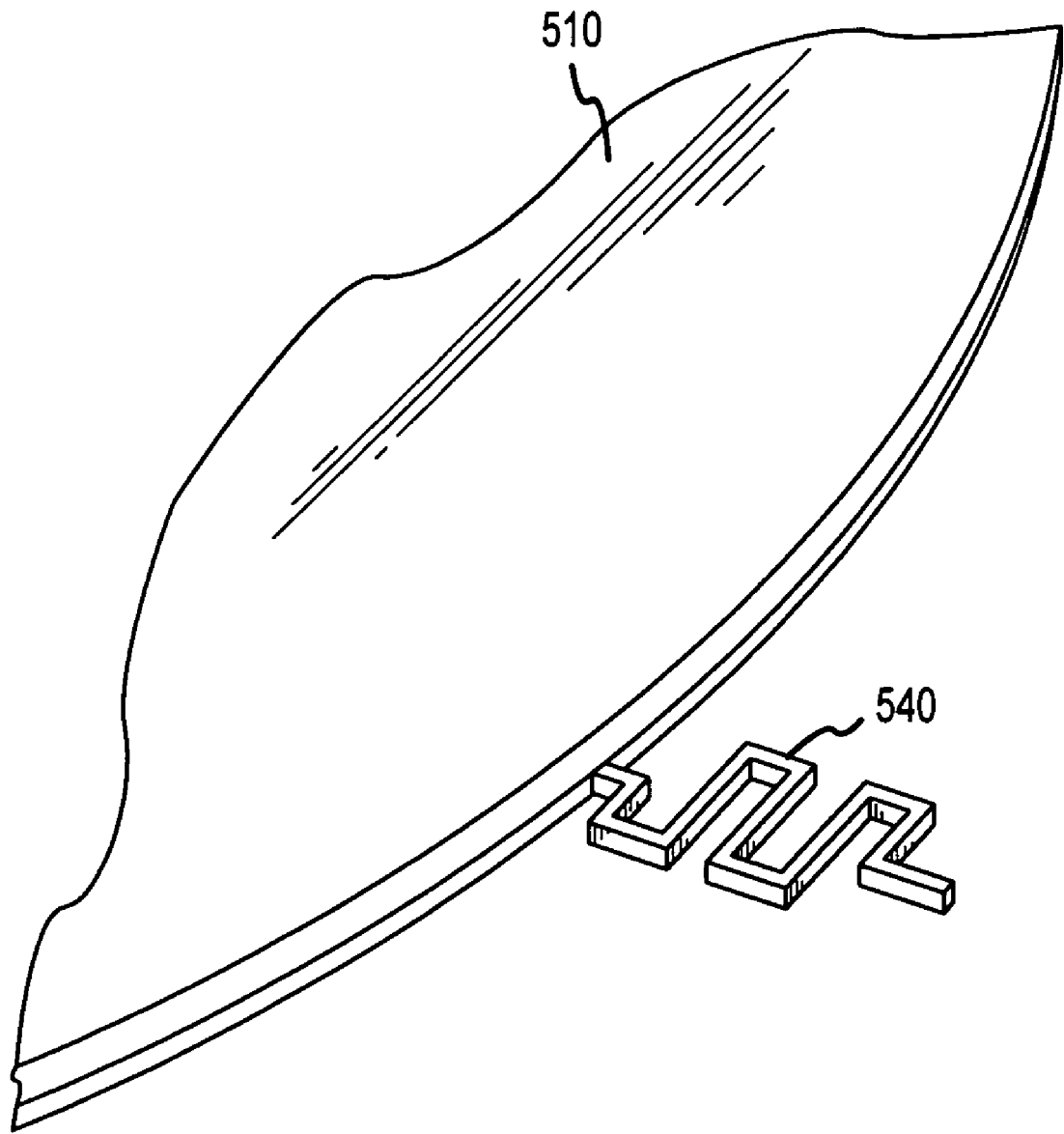
FIG. 7A is a perspective view showing a portion of one embodiment of a MEM mirror having a non-shadowed compliant member extending from an edge thereof.

Referring now FIG. 7A, there is shown a perspective view of a portion of one embodiment of a positionable MEM mirror 510 that includes one or more non-shadowed compliant (i.e., spring-like) members 540 that extend outward from the edge of the mirror 510. The compliant member 540 may be utilized to connect the mirror 510 to an actuator arm (not shown) or the like that is used (possibly in conjunction with other actuator arms connected to the mirror 510 by other compliant members 540) to position the mirror 510 in a desired orientation with respect to the substrate 20. In this regard, the compliant member 540 transmits force from the actuator arm to the mirror 510 while allowing the mirror 510 and actuator arm to move through different radius arcs. Thus, it is generally imperative that the compliant member 540 remain non-metalized, as metalization may induce severe curvature of the compliant member and also undesirable fatigue properties. As with filaments (not shown) temporarily holding the mirror 510 in place, due to its proximity to the periphery of the MEM mirror 510, it is quite possible that the compliant member 540 may become metalized even if a shadow mask is employed when metalizing the surface of the MEM mirror 510.

Figure 7B:
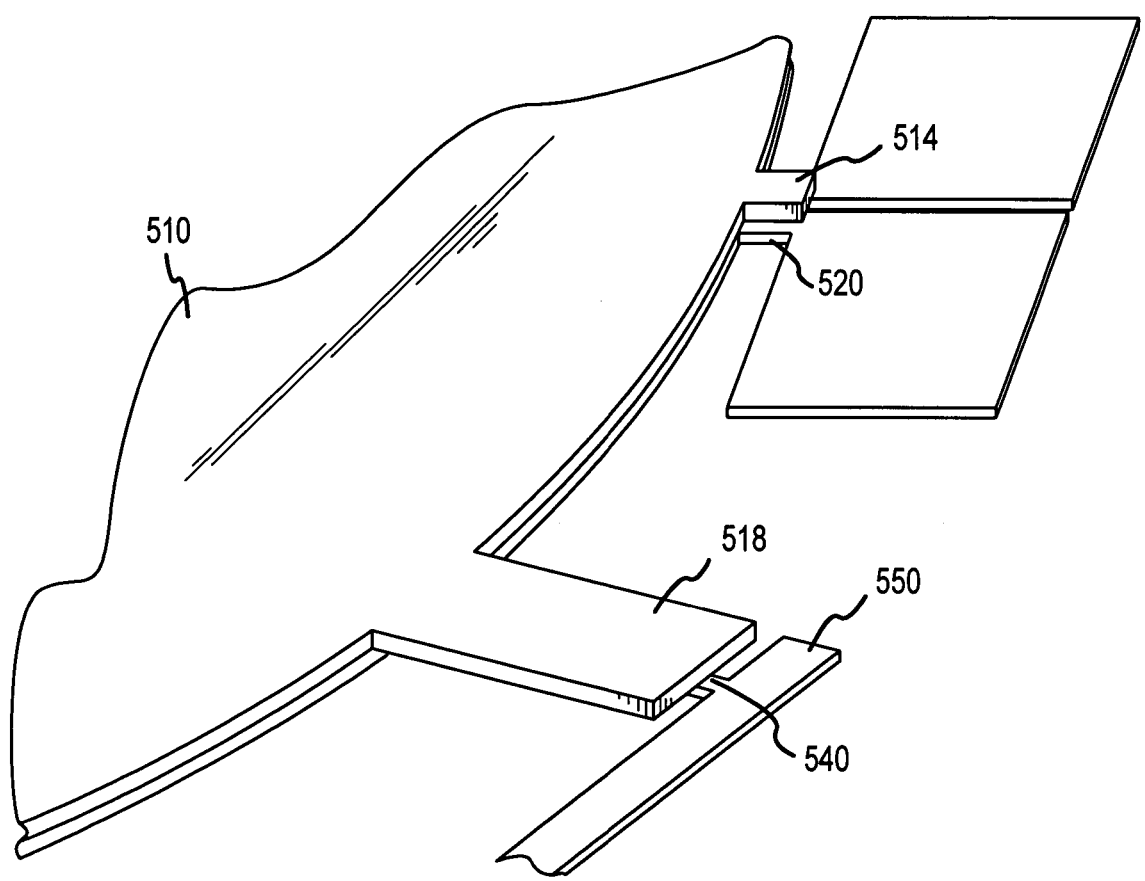
FIG. 7B is a perspective view of a portion of one embodiment of a MEM mirror configured to shadow the compliant member in accordance with the present invention.

FIG. 7B shows one manner of reducing or eliminating possible metalization of the compliant member 540. In the embodiment of FIG. 7B, the upper polysilicon layer of the MEM mirror 510 is patterned to include a tab portion 518 that extends outward from the periphery of the MEM mirror 510 in order to shadow an area on the substrate 20 encompassing the compliant member 540. The MEM mirror 510 also includes a tab portion 514 that shadows one or more filaments 520 temporarily holding the MEM mirror 510 in place until severed as per the embodiment shown in FIG. 6C. Since the compliant member 540 is typically larger than the filaments 520 temporarily holding the MEM mirror 510 in place, tab portion 518 is typically larger than tab portion 514. However, the relatively large tab portion 518 over the compliant member 540 is not expected to cause problems such as undesired contact with the compliant member 540 or actuator arm 550 during operation. This is because upon metalization, the tab portion 518 (as well as tab portion 514) should curl up due to the presence of metal on top of the relatively non-rigid polysilicon tab portions 514, 518.

While various embodiments of the present invention have been described in detail, further modifications and adaptations of the invention may occur to those skilled in the art. However, it is to be expressly understood that such modifications and adaptations are within the spirit and scope of the present invention.

What is claimed is:

1. A self-shadowed microelectromechanical fuse structure for temporarily holding a moveable microelectromechanical structure in place that is shadowed from undesired metalization during a metalization fabrication process step, said self-shadowed fuse structure comprising:

a substrate;

lower and upper layers of material deposited on said substrate, the moveable microelectromechanical structure being patterned from said lower and upper layers of material providing the moveable microelectromechanical structure with lower and upper layer portions;

at least one filament patterned from said lower layer of material, said filament being connected to said lower layer portion of the moveable microelectromechanical structure to temporarily hold the moveable microelectromechanical structure in place; and a tab patterned from said upper layer, wherein said tab shadows an area on said substrate including said filament.

2. The self-shadowed microelectromechanical fuse structure of claim 1 wherein said lower layer of material comprises an electrically conductive material and said filament is severable upon application of sufficient electrical current therethrough.

3. The self-shadowed fuse structure of claim 1 wherein said tab extends laterally from an edge of the upper layer portion of the moveable microelectromechanical structure.

4. The self-shadowed fuse structure of claim 1 wherein said tab extends laterally from an upper layer portion of a bond pad structure that is fixed to said substrate.

* * * * *